(12) United States Patent
Hosaka et al.

(10) Patent No.: US 6,717,065 B2
(45) Date of Patent: Apr. 6, 2004

(54) ELECTRIC CONTACT AND AN ELECTRIC CONNECTOR BOTH USING RESIN SOLDER AND A METHOD OF CONNECTING THEM TO A PRINTED CIRCUIT BOARD

(75) Inventors: Taiji Hosaka, Yokohama (JP); Masaaki Miyazawa, Kawasaki (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 4 days.

(21) Appl. No.: 10/114,775

(22) Filed: Apr. 1, 2002

(65) Prior Publication Data
US 2002/0139574 A1 Oct. 3, 2002

(30) Foreign Application Priority Data
Mar. 30, 2001 (JP) ........................................ 2001-102649

(51) Int. Cl.⁷ ................................................. H05K 1/02
(52) U.S. Cl. ......................... 174/259; 174/254; 174/261
(58) Field of Search ................................ 174/250, 251, 174/254, 257, 259, 261

(56) References Cited

U.S. PATENT DOCUMENTS

| 3,660,726 A | 5/1972 | Ammon et al. |
| 3,822,107 A | 7/1974 | Wogerer |
| 3,914,081 A | 10/1975 | Aoki |
| 3,978,378 A | 8/1976 | Tigner et al. |
| 4,315,724 A | 2/1982 | Taoka et al. |
| 4,398,785 A | 8/1983 | Hedrick |
| 4,778,556 A | 10/1988 | Wery et al. |

(List continued on next page.)

FOREIGN PATENT DOCUMENTS

| DE | 3824314 | 2/1989 |
| DE | 3914959 | 11/1989 |
| DE | 19808178 | 9/1998 |
| EP | 0576785 | 1/1994 |
| EP | 0831565 | 3/1998 |
| GB | 256377 | 8/1926 |
| GB | 2218580 | 11/1989 |
| JP | 61173473 | 8/1996 |
| JP | 09274972 | 10/1997 |
| JP | 10237331 | 9/1998 |
| JP | 2597015 | 4/1999 |
| WO | WO97/50149 | 12/1997 |

OTHER PUBLICATIONS

"Electric Connecting Device and Electric Connector Using Resin Solder and Method of Connecting Electric Wire to Them". by Taiji Hosaka et al.; U. S. patent application 10/114,799, Apr. 1, 2002. pp. 1 to 48 and 30 sheets of drawings.

"A Binding Member for Coaxial Cable and an Electric Connector for Coaxial Cable Both Using Resin Solder, and a Method of Connecting the Binding Member to Coaxial Cable or the Electric Connector", by Taiji Hosaka et al. U.S. patent application 10/114,198; Apr. 1, 2002; pp. 1 to 33 and 13 sheets of drawings.

(List continued on next page.)

Primary Examiner—Kamand Cuneo
Assistant Examiner—Jose H. Alcala
(74) Attorney, Agent, or Firm—W. F. Fasse; W. G. Fasse

(57) ABSTRACT

An electric contact using resin solder is connected to a printed circuit board, which has a conductor provided on a surface thereof. This electric contact comprises a leg, which contacts the conductor of the printed circuit board, and a connecting part, which is connected to the conductor of the counterpart member. At least a part of the leg, which contacts the conductor of the printed circuit board, is made of a lead-free ultrahigh-conductive plastic being a conductive resin composite. An electric connector includes the electric contact and an insulating housing, which holds the electric contact so that the part of the leg, which contacts the conductor of the printed circuit board, is exposed.

17 Claims, 18 Drawing Sheets

U.S. PATENT DOCUMENTS

| | | | |
|---|---|---|---|
| 4,838,799 A | | 6/1989 | Tonooka |
| 5,129,143 A | | 7/1992 | Wei et al. |
| 5,163,856 A | | 11/1992 | McGaffigan et al. |
| 5,347,711 A | * | 9/1994 | Wheatcraft et al. ........... 29/843 |
| 5,357,074 A | | 10/1994 | Pawlikowski |
| 5,386,085 A | * | 1/1995 | Miehls et al. ............... 174/250 |
| 5,427,546 A | | 6/1995 | Garritano et al. |
| 5,517,747 A | * | 5/1996 | Pierro et al. .................. 29/600 |
| 5,626,483 A | | 5/1997 | Naitoh |
| 5,656,798 A | | 8/1997 | Kubo et al. |
| 5,673,480 A | | 10/1997 | Buchheister, Jr. et al. |
| 5,772,454 A | | 6/1998 | Long, Jr. |
| 5,800,211 A | | 9/1998 | Stabile et al. |
| 5,898,991 A | * | 5/1999 | Fogel et al. ............... 29/602.1 |
| 5,959,829 A | * | 9/1999 | Stevenson et al. .......... 361/302 |
| 5,969,952 A | | 10/1999 | Hayashi et al. |
| 6,137,056 A | | 10/2000 | Miyazaki |
| 6,159,046 A | | 12/2000 | Wong |
| 6,176,744 B1 | | 1/2001 | Zito et al. |
| 6,179,631 B1 | | 1/2001 | Downes et al. |
| 6,183,298 B1 | | 2/2001 | Henningsen |
| 6,183,311 B1 | | 2/2001 | Suess et al. |
| 6,194,669 B1 | * | 2/2001 | Bjorndahl et al. .......... 174/261 |
| 6,239,386 B1 | * | 5/2001 | DiStefano et al. .......... 174/262 |
| 6,247,977 B1 | | 6/2001 | Tanaka et al. |
| 6,274,820 B1 | * | 8/2001 | DiStefano et al. .......... 174/254 |
| 6,342,680 B1 | | 1/2002 | Nakagawa et al. |

OTHER PUBLICATIONS

"An Electric Connector for Twisted fair Cable Using Resin Solder and a Method of Connecting Electric Wire to the Electric Connector"; by Taiji Hosaka et al.; U. S. patent application 10/114,197, Apr. 1, 2002; pp. 1 to 33 and 6 sheets of drawings.

"A fair of Electric Connectors Using Resin Solder in One Connector", by Taiji Hosaka et al.; U. S. patent application 10/114,196; Apr. 1, 2002; pp. 1 to 32 and 10 sheets of drawings.

"An Electric Contact and an Electric Connector Both Using Resin Solder and a Method of Connecting Them to A Printed Circuit Board", by Taiji Hosaka et al.; U. S. patent application 0/114,188; pp. 1 to 39 and 11 sheets of drawings.

* cited by examiner

ELECTRIC CONTACT AND AN ELECTRIC CONNECTOR BOTH USING RESIN SOLDER AND A METHOD OF CONNECTING THEM TO A PRINTED CIRCUIT BOARD

CROSS-REFERENCE TO RELATED APPLICATIONS

This application is related to our copending U.S. patent application Ser. Nos. 10/114,188; 10/114,196; 10/114,197 10/114,198; and 10/114,799; all filed on Apr. 1, 2002.

BACKGROUND OF THE INVENTION

1. Field of the Invention

The present invention belongs to a field of electric contacts and electric connectors, and relates to an electric contact and an electric connector, which are mounted on a printed circuit board by surface mounting.

2. Related Art

An electric contact is known, which is made of sheet of a metal such as copper alloy and comprises a leg, which contacts a conductor of a printed circuit board, and a connecting part, which is connected to the counterpart electric contact. This electric contact is surface-mounted on the printed circuit board by soldering the leg of the electric contact on the printed circuit board. An electric connector is also known, which comprises such an electric contact and an insulating housing, which holds the electric contact.

When the above-mentioned conventional electric contact is to be mounted on a printed circuit board by soldering, molten solder will be applied to its leg. However, it may be difficult or impossible to solder the electric contact if, for example, another part is mounted too close to the electric contact. When the electric contact is held in an insulating housing to make an electric connector, the insulating housing may interfere and make it difficult to solder the electric contact onto a printed circuit board. Moreover, this work of applying solder requires careful solder quality control, temperature control and the like, and the man-hours required for control are increased correspondingly. Further, if the electric contact is microminiaturized to connect with, for example, a very fine wire (for example, American Wire Gauge size 36 falls in the category of very fine wire, and the diameter of this electric wire is 0.12 mm approximately), the work of applying molten solder to the leg cannot be done by an automatic machine, and it is necessary to do the work manually by a skilled worker. Hence the productivity is low, and this results in an increase in cost.

When an electric connector having a plurality of electric contacts is to be produced, the electric contacts will be produced by sheet metal processing, and these electric contacts will be assembled with an insulating housing or they will be molded integrally. When such production processes are used, the legs of the electric contacts may set irregularly, making it difficult to obtain coplanarity. This, in turn, is likely to lead to defective connection or short circuit. Here the coplanarity means the flatness of the mounting surface when the electric connector is mounted on a printed circuit board or the like.

Now, Japanese Patent unexamined publication gazette Heisei 10-237331 discloses a lead-free ultrahigh-conductive plastic being a conductive resin composite, comprising a thermoplastic resin, a lead-free solder that can be melted in the plasticated thermoplastic resin, and powder of a metal that assists fine dispersion of the lead-free solder in the thermoplastic resin or a mixture of the powder of the metal and short fibers of a metal.

SUMMARY OF THE INVENTION

This lead-free ultrahigh-conductive plastic exhibits high conductivity, for example, $10^{-3}$ $\Omega \cdot$cm or under in volume resistivity. Moreover, this material can be molded by injection molding and has a high degree of freedom in molding. Furthermore, as this material contains solder, there is no need of separately applying solder. One objective of the present invention is to provide an electric contact and an electric connector, which can solve the above-mentioned problems, and a method of connecting the electric contact and electric connector to a printed circuit board by utilizing the lead-free ultrahigh-conductive plastic, which has such excellent conductivity and moldability and contains solder.

To accomplish the above-mentioned objective, an electric contact using resin solder according to the present invention is the electric contact, which is connected to a printed circuit board, which has a conductor being provided on a surface thereof, the electric contact comprises a leg, which contacts the conductor of the printed circuit board, and a connecting part, which is connected to a conductor of a counterpart member, and at least a part of the leg, which contacts the conductor of the printed circuit board, is made of a lead-free ultrahigh-conductive plastic being a conductive resin composite, comprising a thermoplastic resin, a lead-free solder that can be melted in the plasticated thermoplastic resin, and powder of a metal that assists fine dispersion of the lead-free solder in the thermoplastic resin or a mixture of the powder of the metal and short fibers of a metal.

When the leg of this electric contact is made to contact the conductor of the printed circuit board and the leg is heated, the lead-free solder being contained in the lead-free ultrahigh-conductive plastic of the leg will melt out and stick to the conductor of the printed circuit board. When the solder cools and solidifies, the electric contact will be mounted on the printed circuit board. Hence the work of separately applying solder is not required. Accordingly, even when it is difficult or impossible to solder the electric contact, for example, when another part is mounted too close to the electric contact, the electric contact can be mounted on the printed circuit board. Moreover, as solder quality control, temperature control and the like are not required, the control man-hour is reduced correspondingly. Further, even if the electric contact is microminiaturized, the mounting of the electric contact can be done easily by an automatic machine. Hence the productivity is increased and the cost is reduced. The lead-free ultrahigh-conductive plastic exhibits high conductivity, $10^{-3}$ $\Omega \cdot$cm or under in volume resistivity. Hence the electric resistance of the electric contact can be lowered. Moreover, after the connection of the electric wire, when electricity is passed at a normal level, the lead-free ultrahigh-conductive plastic will not melt out due to heat generation. Further, in comparison with the technology of MID (Molded Interconnection Devices, for example, refer to Registered Utility Model gazette no. 2597015), wherein a conductive plated layer is formed on the surface of an insulator, the lead-free ultrahigh-conductive plastic provides the conductor with a larger cross-sectional area and a larger volume. Hence the resistance of the conductor can be reduced and the heat dissipation is better. This, in turn, allows passage of a larger current. Moreover, as the lead-free ultrahigh-conductive plastic can be molded by injection molding, it gives a greater freedom in molding. Hence it is easy to obtain impedance matching. When the electric contact is formed by injection molding, the accuracy of molding will be improved, and the connector using this electric contact will attain a higher coplanarity than an electric connector using an electric contact of sheet metal. Thus the risks of defective connection and short circuit are reduced. When only a part of the electric contact is made of the lead-free ultrahigh-conductive plastic and other parts are made of a material of which strength and elasticity are higher than those of the lead-free ultrahigh-conductive plastic, for example, a metal, the strength and the elasticity of the electric contact will be enhanced.

DESCRIPTION OF PREFERRED EMBODIMENTS OF THE INVENTION

Figure 1:
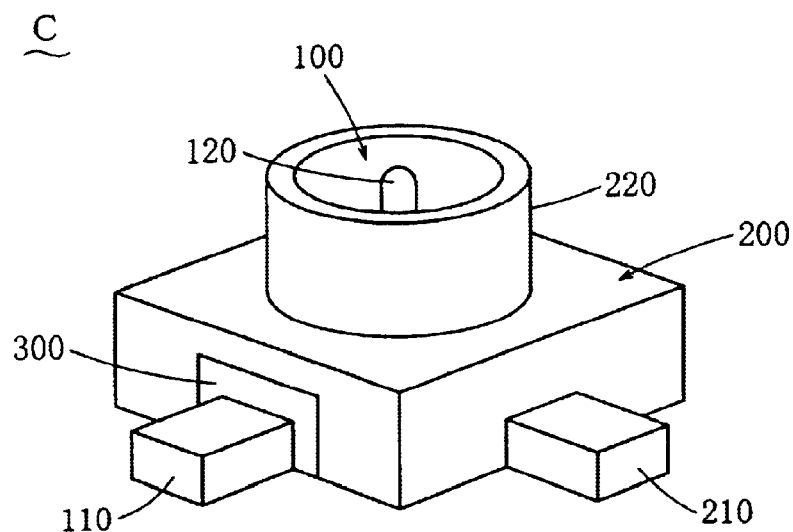
FIG. 1 is a perspective view of the electric connector of the first embodiment according to the present invention.

In the following, some embodiments of the electric contact and the electric connector both using resin solder and the method of connecting them to a printed circuit board according to the present invention will be described.

First, the above-mentioned lead-free ultrahigh-conductive plastic, which is commonly used in all the embodiments of the present invention, will be described in detail according to the description of Japanese Patent unexamined publication gazette Heisei 10-237331. This lead-free ultrahigh-conductive plastic is a conductive resin composite, which comprises a thermoplastic resin, a lead-free solder that can be melted in the plasticated thermoplastic resin, and powder of a metal that assists fine dispersion of the lead-free solder in the thermoplastic resin or a mixture of the powder of the metal and short fibers of a metal. This lead-free ultrahigh-conductive plastic includes those wherein lead-free solder parts that are finely dispersed in the above-mentioned thermoplastic resin are continuously connected to each other in the entire resin. The above-mentioned lead-free ultrahigh-conductive plastic includes those of which above-mentioned conductive resin composite has such a conductivity that the volume resistivity thereof is as low as $10^{-3}$ $\Omega \cdot$cm or under.

The synthetic resin to be used for this lead-free ultrahigh-conductive plastic is not specifically limited, and those that have been used conventionally can be used. However, from the viewpoints of ease in molding and some other physical properties required, it is preferable to use a thermoplastic resin.

The metal to be used for this lead-free ultrahigh-conductive plastic must be a lead-free metal that can half melt when the synthetic resin composite containing the metal is heat-plasticated. As the heat plastication temperature of thermoplastic resin is normally 350° C. or under, low-melting-point metals having a melting point below the above-mentioned plastication temperature are preferable. The metal may be a pure metal or an alloy. As the metal is kneaded under half-melted condition, its configuration is not limited particularly. However, a granular form or a powdery form of metal is preferable since it is easy to handle for dispersion.

Specific examples of the above-mentioned metal include zinc (Zn), tin (Sn), bismuth (Bi), aluminum (Al), cadmium (Cd), indium (In) and their alloys. Examples of preferred alloys among them include low-melting-point alloys such as Sn—Cu, Sn—Zn, Sn—Al and Sn—Ag.

Metals in powdery form for assisting dispersion of the solder include copper (Cu), nickel (Ni), aluminum (Al), chromium (Cr) and their alloys all in powdery form. The finer is the particle diameter of the metal powder, the finer is the dispersion of the solder after kneading. However, it is not necessary to provide powder of a common particle diameter. Powder of a metal having a distribution of particle diameters can be used. The usage of the metal components in the above-mentioned lead-free ultrahigh-conductive plastic is from 30 to 75% and preferably from 45 to 65% in volume ratio to the entire conductive resin composite.

The above-mentioned lead-free ultrahigh-conductive plastic uses a resin and a low-melting-point alloy (lead-free solder) which does not contain lead from the viewpoint of environment. As they are kneaded when the metal is kept in a half-melted state, the lead-free solder being metal components can be dispersed finely throughout the resin. Moreover, as kneading is made when the lead-free solder is kept under a half-melted condition, the dispersed solder fractions are kept connected continuously to each other. This connection is not just a contact but a junction between solder fractions. As the conductivity thus achieved differs from that obtained by contacts among metal fractions, even if the molding is heated to a high temperature, the junctions will not break, thus the molding stably exhibits low resistance.

When this material is to be formed by injection molding, as the metal components are partly half-melted and the lead-free solder is finely dispersed, the material can be formed by injection molding into fine configurations although the material contains a large amount of metal components. Hence electric contacts and the like can be formed by processes of injection molding alone. Moreover, as no plating is required, a conductive part of low resistance can be formed inside the injection molding.

To produce the above-mentioned conductive resin composite, kneading machines and extruding machines for conventional resins can be used.

Next, embodiments of the above-mentioned lead-free ultrahigh-conductive plastic will be described.

Embodiment 1

45% by volume of ABS resin (produced by Toray; Toyolac 441), 40% by volume of lead-free solder (produced by Fukuda Kinzoku Hakufun Kogyo; Sn—Cu—Ni—AtW-150) and 15% by volume of copper powder (produced by Fukuda Kinzoku Hakufun Kogyo; FCC-SP-77, mean particle diameter 10 $\mu$m) were lightly mixed together and fed into a kneader (Moriyama Seisakusho make, double-screw pressurized type) which was set at 220° C. The mixture was kneaded, without preheating time, at a rate ranging from 25 to 50 r.p.m. for 20 minutes; the resin was heat-plasticated and the solder, under half-melted condition, was dispersed throughout the resin.

The kneaded material was pelletized by a plunger extrusion pelletizer (Toshin make, Model TP60-2) at the die temperature ranging from 200 to 240° C. to produce pellets. These pellets were used to carry out injection molding into molds by an injection molding machine (Kawaguchi Tekko make, KS-10B). The preset temperature was from 230 to 280° C., and the mold temperature was from the ordinary room temperature to 150° C. The injection moldings obtained showed no sign of segregation of metal, and their surfaces were even.

Observation, under an optical microscope, of the state of dispersion of the solder of this injection molding showed that the solder was evenly dispersed throughout the resin and solder fractions were about 5 $\mu$m in size. The volume resistivity of this specimen was on the order of $10^{-5}$ $\Omega \cdot$cm.

Embodiment 2

45% by volume of PBT resin (produced by Polyplastic), 40% by volume of lead-free solder (produced by Fukuda Kinzoku Hakufun Kogyo; Sn—Cu—Ni—AtW-150) and 15% by volume of copper powder (produced by Fukuda Kinzoku Hakufun Kogyo; FCC-SP-77, mean particle diameter 10 $\mu$m) were lightly mixed together and fed into the kneader (Moriyama Seisakusho make, double-screw pressurized type) which was set at 220° C. The mixture was kneaded, without preheating time, at a rate ranging from 25 to 50 r.p.m. for 20 minutes while efforts were made to prevent the temperature of the kneaded material from rising to 235° C. or over, by lowering the rate of revolution, cooling, etc.; the resin was heat-plasticated and the solder, under half-melted condition, was dispersed throughout the resin. Observation, under an optical microscope, of the state of dispersion of the solder of the kneaded material showed that the solder was evenly dispersed throughout the resin and solder fractions were about 5 $\mu$m in size.

Embodiment 3

35% by volume of ABS resin (produced by Toray; Toyolac 441), 55% by volume of lead-free solder (produced by Fukuda Kinzoku Hakufun Kogyo; Sn—Cu—Ni—AtW-150) and 10% by volume of copper powder (produced by Fukuda Kinzoku Hakufun Kogyo; FCC-SP-77, mean particle diameter 10 $\mu$m) were lightly mixed together, and the total of the metal components was set at 65% by volume. Then the mixture was fed into the kneader (Moriyama Seisakusho make, double-screw pressurized type) which was set at 220° C. The mixture was kneaded, without preheating time, at a rate ranging from 25 to 50 r.p.m. for 20 minutes; the resin was heat-plasticated and the solder, under half-melted condition, was dispersed throughout the resin.

The kneaded material was pelletized by the plunger extrusion pelletizer (Toshin make, Model TP60-2) at the die temperature ranging from 200 to 240° C. to produce pellets. These pellets were used to carry out injection molding into molds by the injection molding machine (Kawaguchi Tekko make, KS-10B). The preset temperature of the machine was from 230 to 280° C., and the mold temperature was from the ordinary room temperature to 150° C. The injection moldings obtained showed no sign of segregation of metal, and their surfaces were even. Observation, under an optical microscope, of the state of dispersion of the solder showed that the solder was evenly dispersed throughout the resin and solder fractions were about 100 $\mu$m or under in size. The volume resistivity of this specimen was on the order of $4 \times 10^{-5}$ $\Omega \cdot$cm.

As clearly shown by the above-mentioned specific examples, the lead-free solder could be dispersed finely throughout the resins, and even when a large volume of metal components as high as 65% by volume were mixed, a kneaded material that did not show any segregation, under heating, of metals from the resin was obtained successfully. As the solder fractions were continuous to each other in this lead-free ultrahigh-conductive plastic, the conductivity of the plastic did not show any deterioration even when the temperature changed, thus the plastic stably exhibited high conductivity. In injection molding, the plastic was successfully molded into fine configurations without any clogging.

Figure 31:
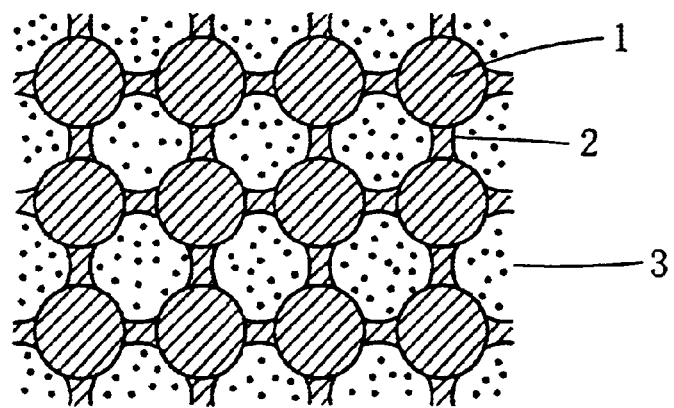
FIG. 31 is a schematic structural diagram of the lead-free ultrahigh-conductive plastic used in the embodiments.

With the use of this lead-free ultrahigh-conductive plastic, electric contacts and the like having a three-dimensional configuration and low resistance can be formed by injection molding. In the following, with reference to the attached drawings, specific examples will be described in detail. FIG. 31 is a schematic structural diagram of the above-mentioned lead-free ultrahigh-conductive plastic. As shown in this diagram, in this lead-free ultrahigh-conductive plastic, the lead-free solders 1 are connected to each other by the solders 2 which are melted in the plastic 3. Hence the lead-free solders 1 are junctioned to each other and the conductivity is high and the reliability of the connection is high.

Figure 32:
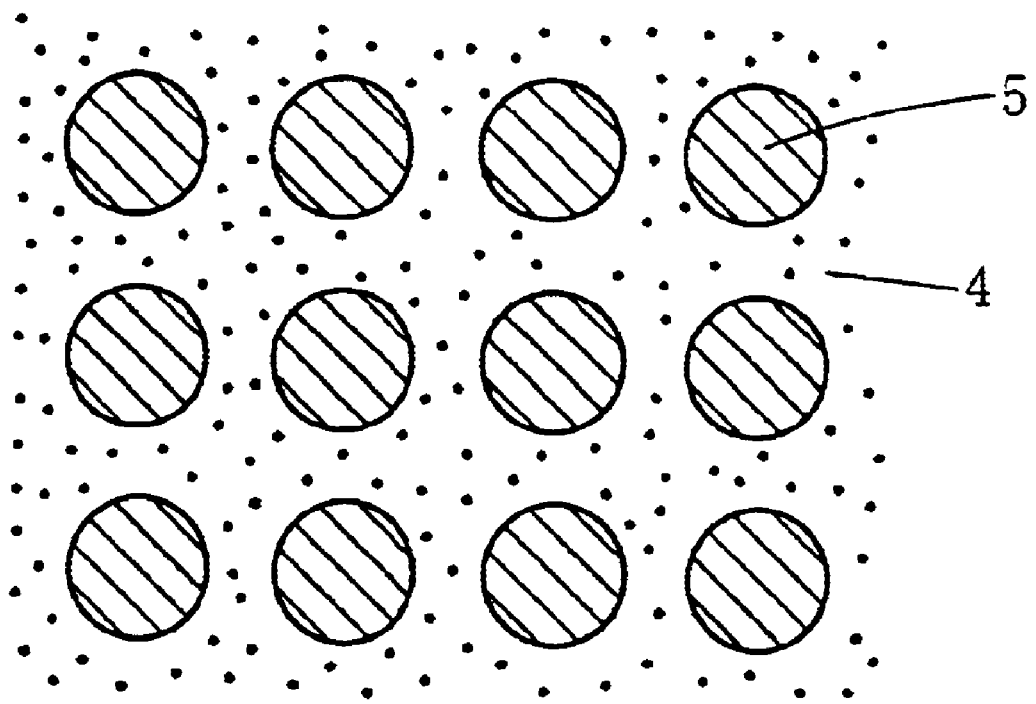
FIG. 32 is a schematic structural diagram of the conventional plastic wherein powder of a metal that does not melt is kneaded in a resin.

In contrast to this, as shown in FIG. 32, when powder 5 of a conventional metal that does not melt is kneaded in a plastic 4, the metal particles will not connect to each other unless a large amount of the metal content is mixed. Hence conductivity cannot be obtained.

Thus the lead-free ultrahigh-conductive plastic shows a low resistance, does not exhibit deterioration in conductivity in a variety of environments, and has a high reliability.

To sum up, when a resin and a low-melting-point alloy (lead-free solder) which does not contain lead from the viewpoint of environment are used, and they are kneaded with the metal being kept in half-melted condition, the lead-free solder being the metal components can be dispersed finely throughout the resin. Moreover, as kneading is made when the lead-free solder is kept in half-melted condition, the dispersed solder fractions are kept connected continuously to each other. This connection is not just a contact but a junction between solder fractions. As the conductivity thus achieved differs from that obtained by contacts among metal fractions, even if the molding is heated to a high temperature, the junctions will not break, thus the molding stably exhibits low resistance.

When this material is to be formed by injection molding, as the metal components are partly half-melted and the lead-free solder is finely dispersed, the material can be formed by injection molding into fine configurations although the material contains a large amount of metal components. Hence electric contacts and the like can be formed by processes of injection molding alone. Moreover, as no plating is required, a conductive part of low resistance can be formed inside the frame (injection molding).

Figure 2:
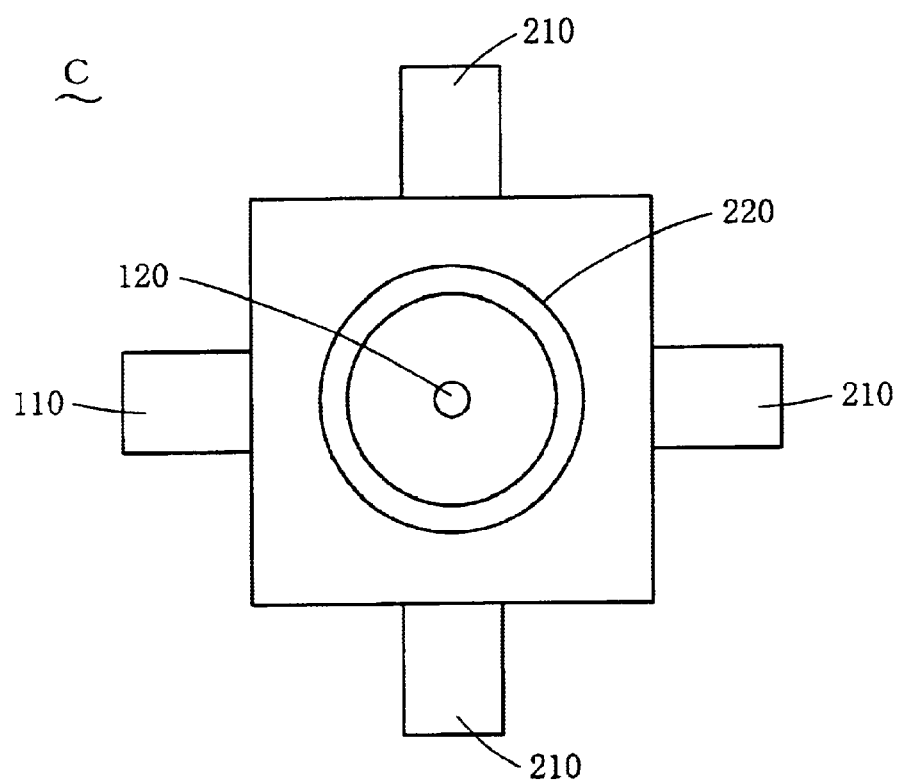
FIG. 2 is a plan view of the electric connector of the first embodiment.
Figure 4:
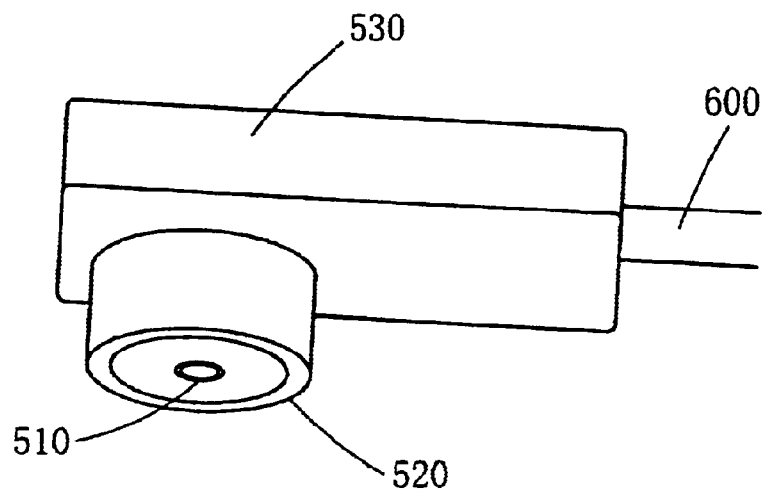
FIG. 4 is a perspective view of the counterpart electric connector of the electric connector of the first embodiment.

Next, embodiments of the electric contact using the resin solder and embodiments of the electric connector using the electric contact using resin solder will be described. FIG. 1 and FIG. 2 show the electric contact and the electric connector of the first embodiment. This electric connector C is a male connector, which is mounted on a printed circuit board 400, and for example, a female connector 500, which is shown in FIG. 4, fits with the electric connector C. This electric connector C comprises a first electric contact 100 having conductivity, a second electric contact 200 having conductivity, and an insulating housing 300, which holds the first electric contact 100 and the second electric contact 200. The counterpart member of the first electric contact 100 is the first counterpart electric contact 510, and the counterpart member of the second electric contact 200 is the second counterpart electric contact 520.

The first electric contact 100 comprises a leg 110, which contacts a conductor 410 of a printed circuit board 400, and a connecting part 120, which is connected to a conductor of the first counterpart electric contact 510. The second electric contact 200 comprises legs 210, which contact a conductor of the printed circuit board 400, and a connecting part 220, which is connected to a conductor of the second counterpart electric contact 520. The legs 110, 210 and the connecting parts 120, 220 of the first electric contact 100 and the second electric contact 200 are not covered by the insulating housing 300 but exposed. The connecting part 120 of the first electric contact 100 is formed to fit with the connecting part of the first counterpart electric contact 510. The connecting part 220 of the second electric contact 200 is formed to fit with the connecting part of the second counterpart electric contact 520.

As shown in FIG. 4, the first counterpart electric contact 510 and the second counterpart electric contact 520 are held by an insulating housing 530 of the counterpart electric connector 500. The connecting part of the first counterpart electric contact 510 is formed into a tube and is connected to the centered conductor of the terminal end of a coaxial cable 600, and the connecting part of the second counterpart electric contact 520 is formed into a tube and is connected to the outer conductor of the terminal end of the coaxial cable 600. The leg 110 of the first electric contact 100 of the electric connector C is formed into a bar. The connecting part 120 is formed into a pin so that it fits with the connecting part of the first counterpart electric contact 510, and this connecting part 120 rises from the leg 110. The legs 210 of the second electric contact 200 of the electric connector C are formed into bars and extend from the body of the second electric contact 200 in three directions. The connecting part 220 is formed into a tube so that it fits with the connecting part of the second counterpart electric contact 520, and rises from the body of the legs 210 so that it surrounds the connecting part 120 of the first electric contact 100. The leg of the second electric contact may be one just like the case of the first electric contact, but when the leg is split into a plurality of branches, the stability when it is connected to the printed circuit board 400 will be improved. The insulating housing 300 is provided between the first electric contact 100 and the second electric contact 200 and insulates the first electric contact 100 from the second electric contact 200.

As for the first electric contact 100 and the second electric contact 200, at least the parts of the legs 110, 210, which contact the conductors 410 of the electric circuit board 400 are made of the lead-free ultrahigh-conductive plastic being the conductive resin composite, and other parts are made of another material having conductivity. In the case of this embodiment, the leg 110 of the first electric contact 100 is made of the lead-free ultrahigh-conductive plastic, and the connecting part 120 is made of a metal such as a copper alloy. The second electric contact 200 is entirely made of the lead-free ultrahigh-conductive plastic.

The insulating housing 300 is made of a thermoplastic resin, and the first electric contact 100, the second electric contact 200 and the insulating housing 300 are molded integrally.

Figure 6:
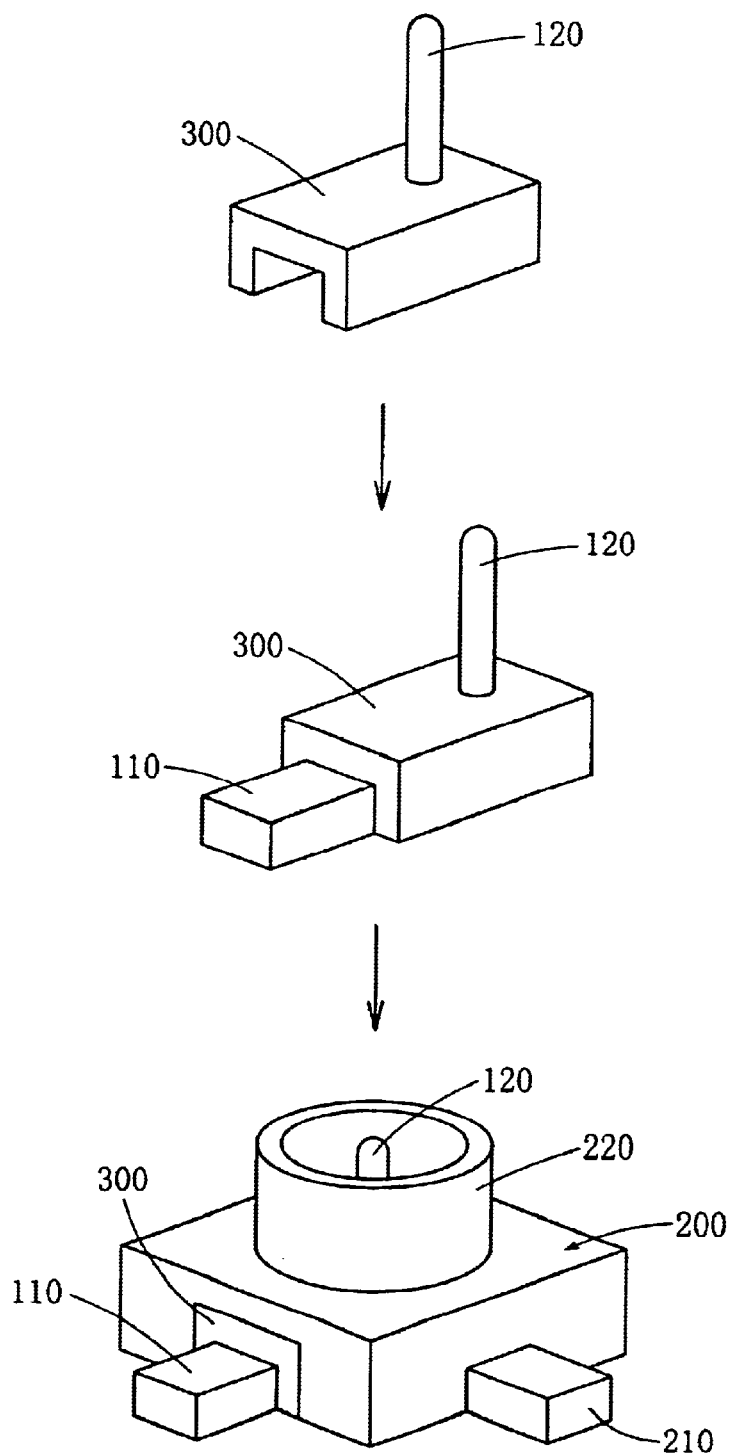
FIG. 6 is an explanatory diagram showing the first method of producing the electric connector of the first embodiment.
Figure 7:
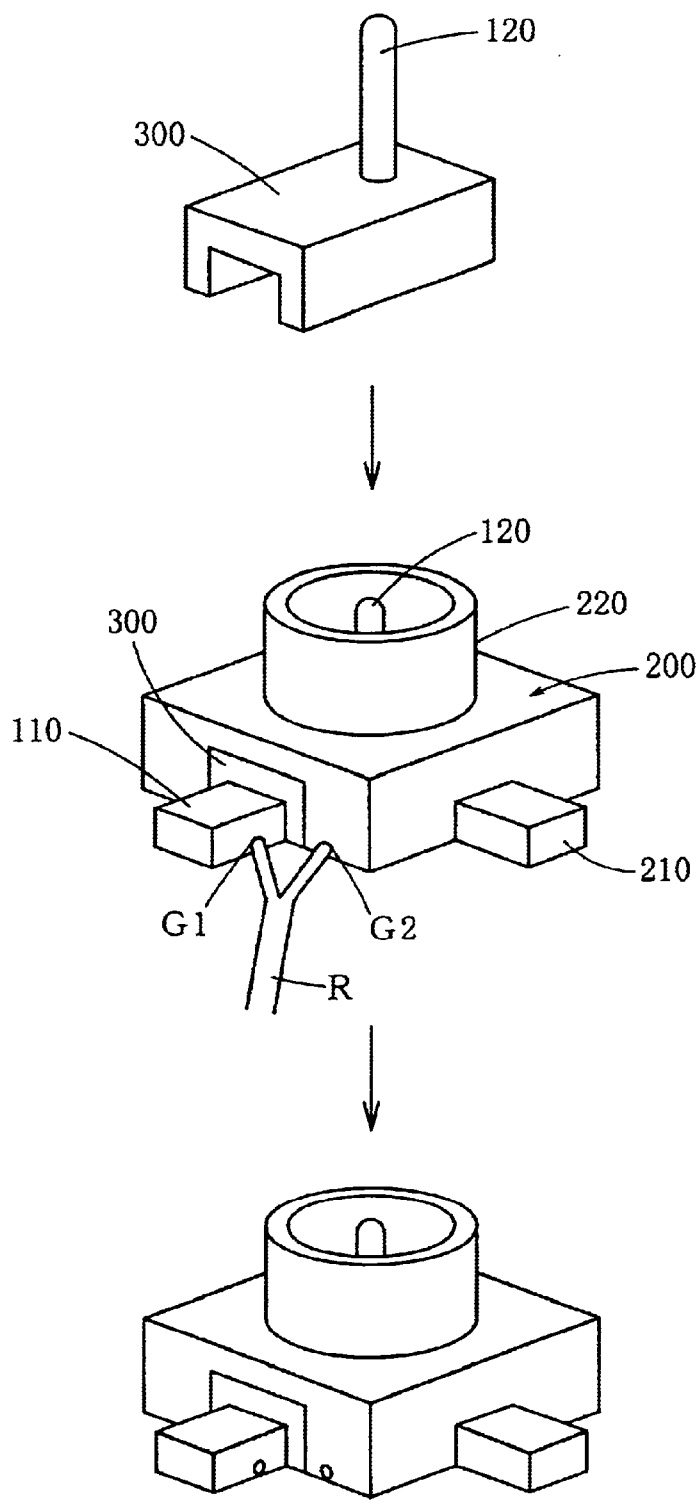
FIG. 7 is an explanatory diagram showing the second method of producing the electric connector of the first embodiment.

Two examples of the method of producing this electric connector C will be described. As for the example shown in FIG. 6, as indicated in the upper diagram, the pin-shaped connecting part 120 of the first electric contact 100 is used as an insert part, and the insulating housing 300 is insert-molded to hold the connecting part 120 and produce the primary molding. Next, as shown in the middle diagram, the primary molding is used as an insert part, and the leg 110 of the first electric contact 100 is insert-molded with the primary molding to produce the secondary molding. Next, as shown in the bottom diagram, the secondary molding is used as an insert part, and the second electric contact 200 is insert-molded to embrace the secondary molding and produce the final molding. This method of production requires three molds. Next, as for the example shown in FIG. 7, the pin-shaped connecting part 120 of the first electric contact 100 is used as an insert part, and the insulating housing 300 is insert-molded to hold the connecting part 120 and produce the primary molding. Next, as shown in the middle diagram, the primary molding is used as an insert part, and the leg 110 of the first electric contact 100 and the second electric contact 200 are insert-molded to embrace the primary molding and produce the secondary molding. In this process, the resin is fed to the cavity for molding the leg 110 of the first electric contact 100 from the gate G1, and the resin is fed to the cavity for molding the second electric contact 200 from the gate G2. Next, as shown in the bottom diagram, the runner R remaining and connecting to these gates G1, G2 is cut away from the secondary molding to produce the final molding. This method of production requires two molds. When the connecting part 120 of the first electric contact 100 is made of a material which is similar to that of the leg 110, the electric connector C can be produced by simple multi-color injection molding without using any insert part.

Figure 3:
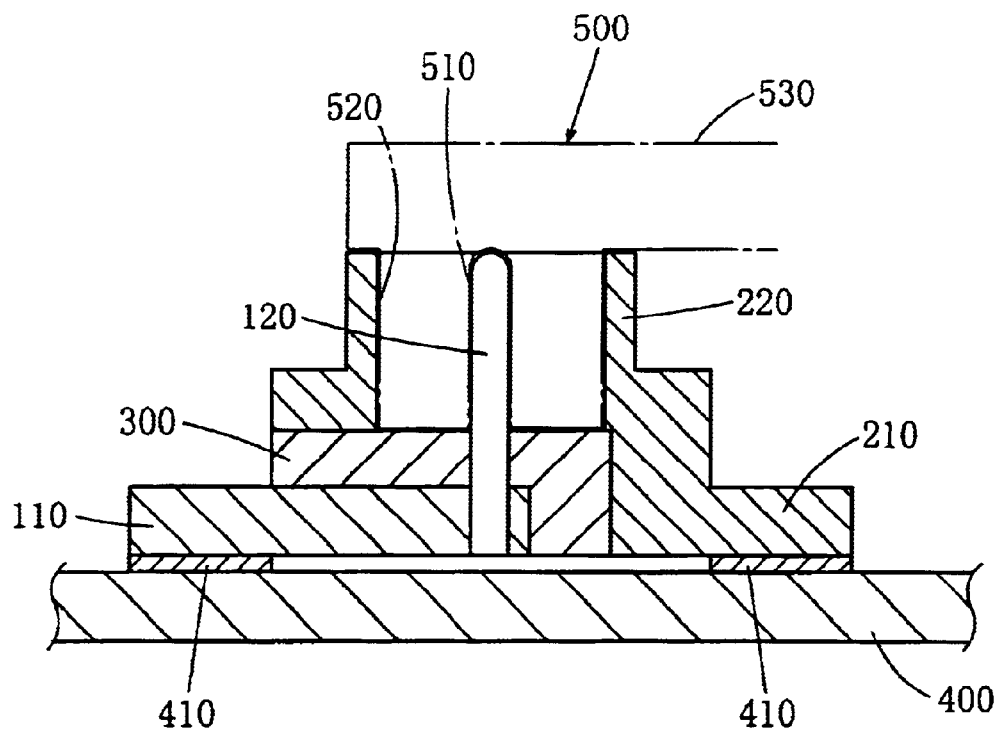
FIG. 3 is a sectional view of the electric connector of the first embodiment, which is mounted on a printed circuit board.

As shown in FIG. 3, when the leg 110 of the first electric contact 100 is made to contact the conductor 410 of the printed circuit board 400, the legs 210 of the second electric contact 200 are made to contact another conductor 410 of the printed circuit board 400 and the legs 100, 210 are heated, the lead-free solder being contained in the lead-free ultrahigh-conductive plastic of the legs 110, 210 will melt out to stick to the conductors 410 of the printed circuit board 400. When the solder cools and solidifies, the electric contacts 100, 200 will be mounted on the printed circuit board 400. The above-mentioned heating is effected by, for example, blowing hot air or irradiating high frequency waves or laser beams to give thermal energy. Accordingly, the work of separately applying solder is not required. Thus even when it is difficult or impossible to solder the electric contacts 100, 200, for example, when another part is mounted too close to them, the electric contacts 100, 200 can be mounted on the printed circuit board 400. Moreover, solder quality control, temperature control and the like are not required, and the man-hours required for control are reduced correspondingly. Furthermore, even when the electric contacts 100, 200 are microminiaturized, the mounting of the electric contacts 100, 200 can be done by an automatic machine, and the productivity is enhanced and the cost is reduced. The lead-free ultrahigh-conductive plastic exhibits high conductivity, for example, $10^{-3}$ $\Omega \cdot cm$ or under in volume resistivity. Hence the electric resistances of the electric contacts 100, 200 can be reduced. After the mounting of the electric contacts 100, 200 on the printed circuit board 400, when electricity is passed at a normal level, the lead-free ultrahigh-conductive plastic will not melt out due to heat generation. Moreover, in comparison with the technology of MID wherein a conductive plated layer is formed on the surface of an insulator, the lead-free ultrahigh-conductive plastic provides the conductor with a larger cross-sectional area and a larger volume. Hence the resistance of the conductor can be reduced and the heat dissipation is better. This in turn allows passage of a larger current. As the lead-free ultrahigh-conductive plastic can be molded by injection molding, it gives a higher degree of freedom in molding. Hence it is easy to obtain impedance matching. Injection molding herein includes insert molding, which was described above. When the electric contacts 100, 200 are formed by injection molding, the accuracy of molding will be improved, and the connector C using these electric contacts 100, 200 will attain a higher coplanarity than an electric connector using electric contacts of sheet metal. Thus the risks of defective connection and short circuit are reduced.

The leg 110 of the first electric contact 100 is made of the lead-free ultrahigh-conductive plastic, and the connecting part thereof is made of a metal such as a copper alloy. When only a part of the electric contacts is made of the lead-free ultrahigh-conductive plastic and other parts are made of a conductive material of which strength and elasticity are higher than those of the lead-free ultrahigh-conductive plastic, the strength and elasticity of the electric contacts will be enhanced.

The present invention does not limit the configuration of the connecting part of the electric contact using resin solder. Among the embodiments, the first electric contact 100 and the second electric contact 200 using resin solder of the first embodiment have connecting parts 120, 220, which are formed to fit with the connecting parts of their counterpart members, namely, the first counterpart electric contact 510 and the second counterpart electric contact 520. With this arrangement, the counterpart electric contacts 510, 520 will be connected to the printed circuit board 400 via the electric contacts using resin solder, 100, 200.

The present invention does not limit the material of the insulating housing to thermoplastic resins. The present invention also includes embodiments wherein the electric contacts are assembled in an insulating housing by, for example, insertion. Among the embodiments of the present invention, in the electric connector C of the above-mentioned embodiment, the insulating housing 300 is made of a thermoplastic resin, and the first electric contact 100 and the second electric contact 200 and the insulating housing 300 are molded integrally. With this arrangement, as the electric connector C is produced by injection molding or the like, the efficiency of production is higher in comparison with a case wherein the first electric contact 100, the second electric contact 200 and the insulating housing 300 are produced separately and they are assembled together. Thus it is suited to mass production.

Figure 5:
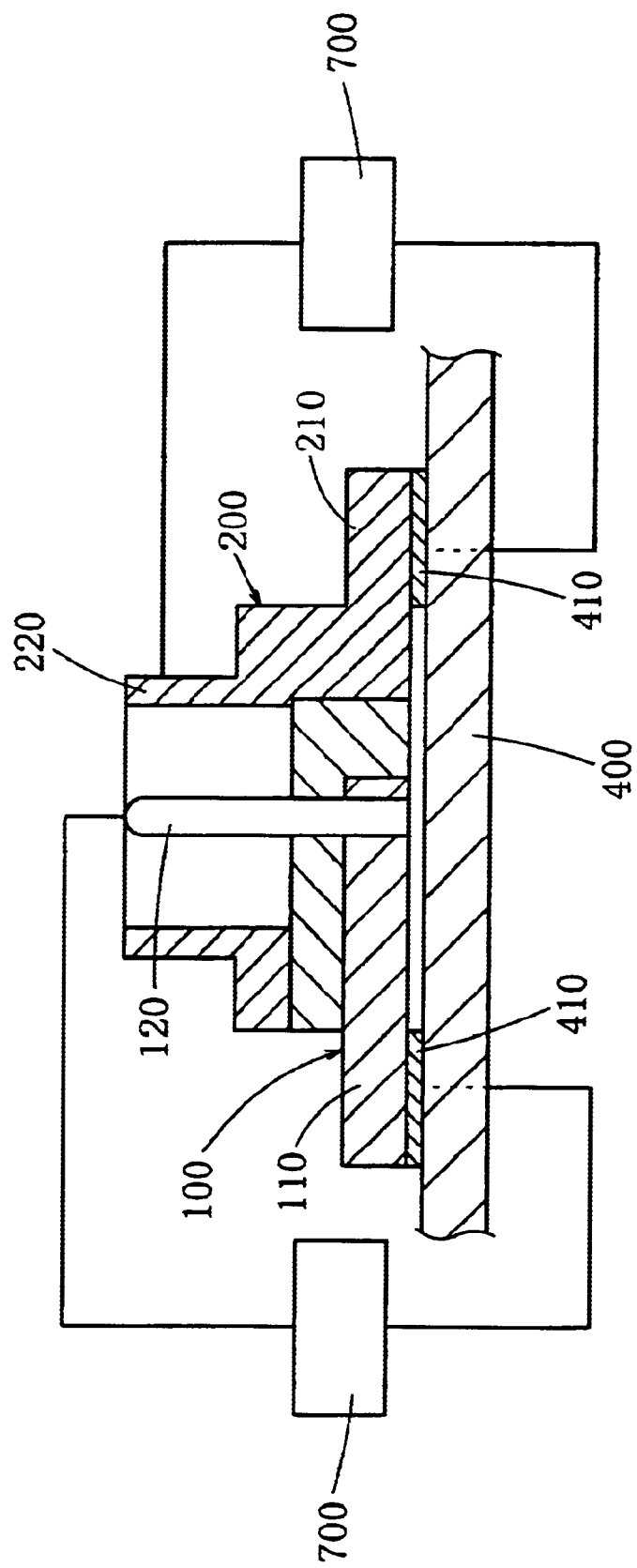
FIG. 5 is a schematic diagram showing another embodiment of the method of connecting the electric connector of the first embodiment to a printed circuit board.

Another embodiment of the method of connecting this electric connector C to the printed circuit board 400 will be described. As shown in FIG. 5, first the leg 110 of the first electric contact 100 is made to contact a conductor 410 of the printed circuit board 400, and the leg 210 of the second electric contact 200 is made to contact another conductor 410 of the printed circuit board. Next, electricity is passed between the first electric contact 100 and the conductor 410 of the printed circuit board 400, and between the second electric contact 200 and the other conductor 410 of the printed circuit board 400, by power sources 700, respectively, to melt the lead-free solder being contained in the leg 110 of the first electric contact 100 and the leg 210 of the second electric contact 200 and connect the first electric contact 100 and the second electric contact 200 to the conductors 410.

When this connecting method is used, as the legs 110, 210 generate heat by themselves, even when it is difficult to externally heat the legs 110, 210, for example, due to interference of the insulating housing 300, etc., the first electric contact 100 and the second electric contact 200 can be connected to the conductors 410 of the printed circuit board 400.

The present invention includes other embodiments of the electric connector and the electric contact of the first embodiment. The other embodiments include an electric contact of which male-female fitting relationship with the counterpart electric contact is reversed, electric connectors having electric contacts of one kind or three or more kinds, electric contacts having one electric contact or three or more electric contacts, and electric contacts which are not assembled in an electric connector but connected to a printed circuit board singularly. The counterpart electric contacts include those that are connected to one end of electric wire of another kind, and those that are connected to a printed circuit board. The present invention includes, when the counterpart member is an electric wire, the cases wherein the counterpart member is a printed circuit board.

Figure 8:
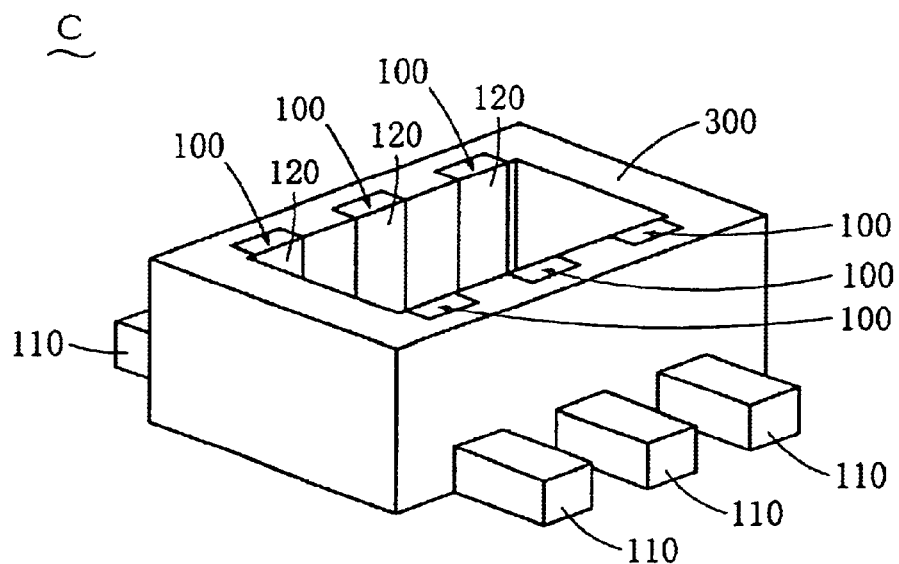
FIG. 8 is a perspective view of the electric connector of the second embodiment.
Figure 9:
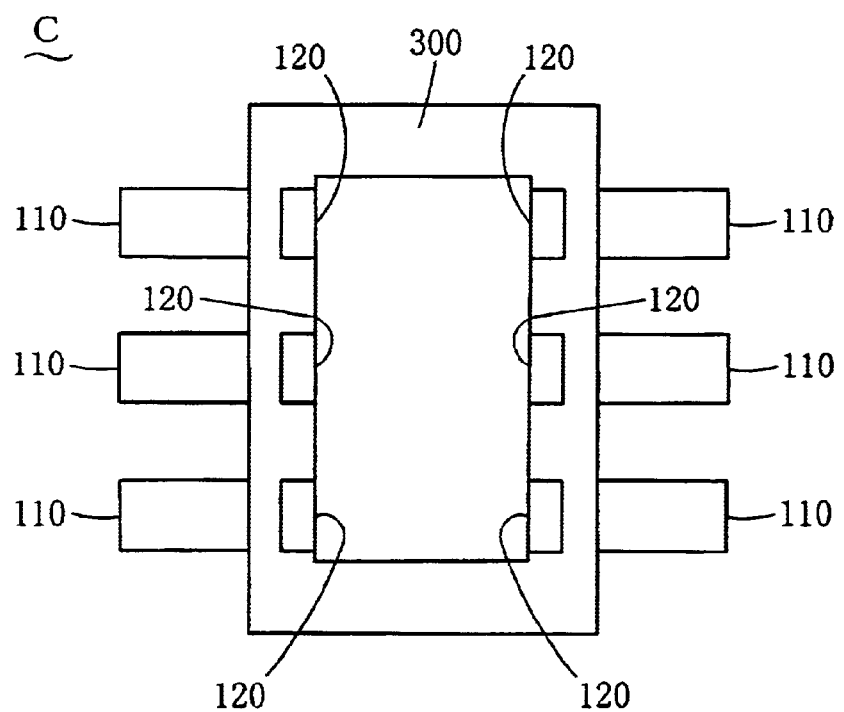
FIG. 9 is a plan view of the electric connector of the second embodiment.

In the following, other embodiments will be described. When there is an embodiment which is closest to an embodiment to be described, the description of the former will be quoted together with the marks. Then additional description will be given regarding differences in structure from the closest embodiment. FIG. 8 and FIG. 9 show the electric contact and the electric connector of the second embodiment. This electric connector is a female connector, which is mounted on a printed circuit board. This electric connector fits with, for example, a male connector, which will be shown below as the third embodiment. The electric connector C comprises electric contacts 100, which have conductivity, and an insulating housing 300, which holds these electric contacts 100. The counterpart member of the electric contact 100 is an electric contact 510, which has conductivity. Here there are six electric contacts 100, but the number of poles of the present invention is not limited by this embodiment.

The electric contact 100 comprises a leg 110, which contacts a conductor 410 of the printed circuit board, and a connecting part 120, which is connected to the conductor of the counterpart electric contact 510. The leg 110 and the connecting part 120 of this electric contact 100 are not covered by the insulating housing 300 but exposed. The connecting part 120 of the electric contact 100 is formed to fit with the connecting part of the counterpart electric contact 510.

Figure 10:
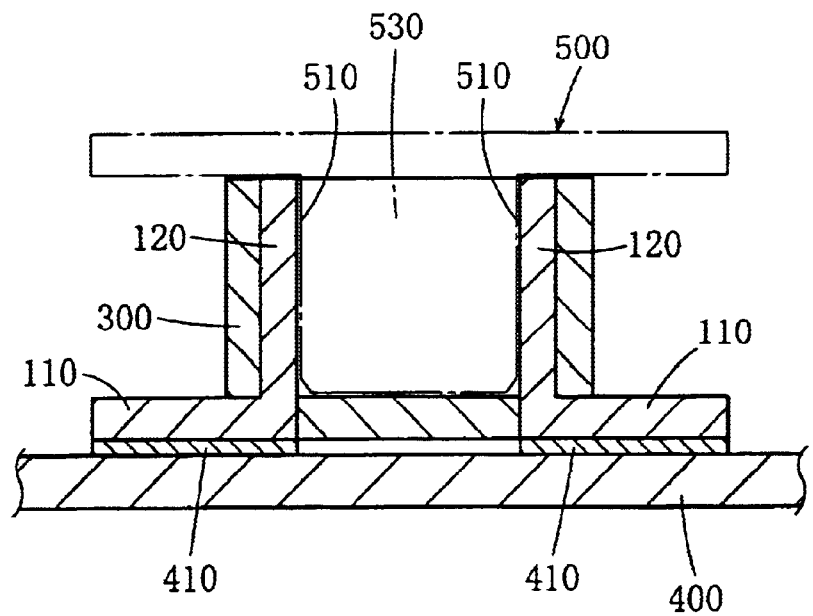
FIG. 10 is a sectional view of the electric connector of the second embodiment, which is mounted on a printed circuit board.

As shown in FIG. 10, the counterpart electric contacts 510 are held in the insulating housing 530 of the counterpart electric connector 500. This insulating housing 530 has a protrusion. The counterpart electric contacts 510 extend on the surface of the protrusion in the direction of insertion and withdrawal of the counterpart electric connector 500. On the other hand, the insulating housing 300 of the electric connector C is formed into a box having a concaved part at the center thereof, and the protrusion of the counterpart electric connector 500 is to fit into this concaved part. The electric contact 100 is formed into a bar, and in this embodiment, it is formed into an L form. The connecting part 120 of the electric contact 100 is set in and exposed on the inner side of the concaved part of the insulating housing 300, and the connecting part 120 extends in the direction of insertion and withdrawal of the counterpart electric connector 500. The leg 110 penetrates the insulating housing 300 and protrudes outwards.

Of this electric contact 100, at least the part of the leg 110, which contacts the conductor 410 of the printed circuit board 400 is made of the lead-free ultrahigh-conductive plastic being the conductive resin composite, and other parts are made of another material having conductivity. In the case of this embodiment, the entirety of the electric contact 100 is made of the lead-free ultrahigh-conductive plastic.

The insulating housing 300 is made of a thermoplastic resin, and the electric contacts 100 and the insulating housing 300 are molded integrally.

This electric connector C can be produced by the so-called multi-color injection molding, wherein the electric contacts 100 and the insulating housing 300 are molded stepwise by injection molding. If a material other than thermoplastic resins, for example, a metal, is partly used, the electric connector C may be produced by insert molding.

The method of mounting the electric contact and the electric connector of the second embodiment on a printed circuit board and the functions and effects obtained are similar to those of the first embodiment.

Figure 11:
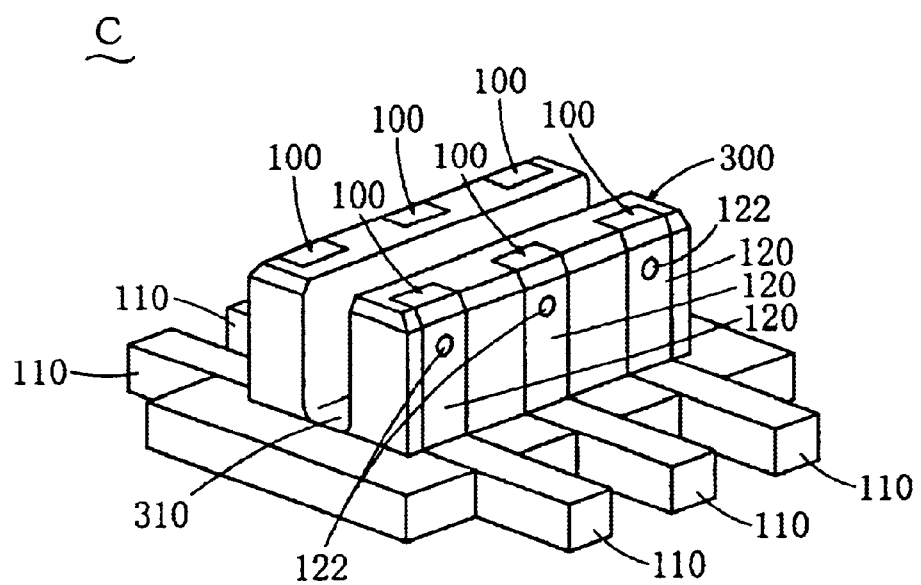
FIG. 11 is a perspective view of the electric connector of the third embodiment.
Figure 12:
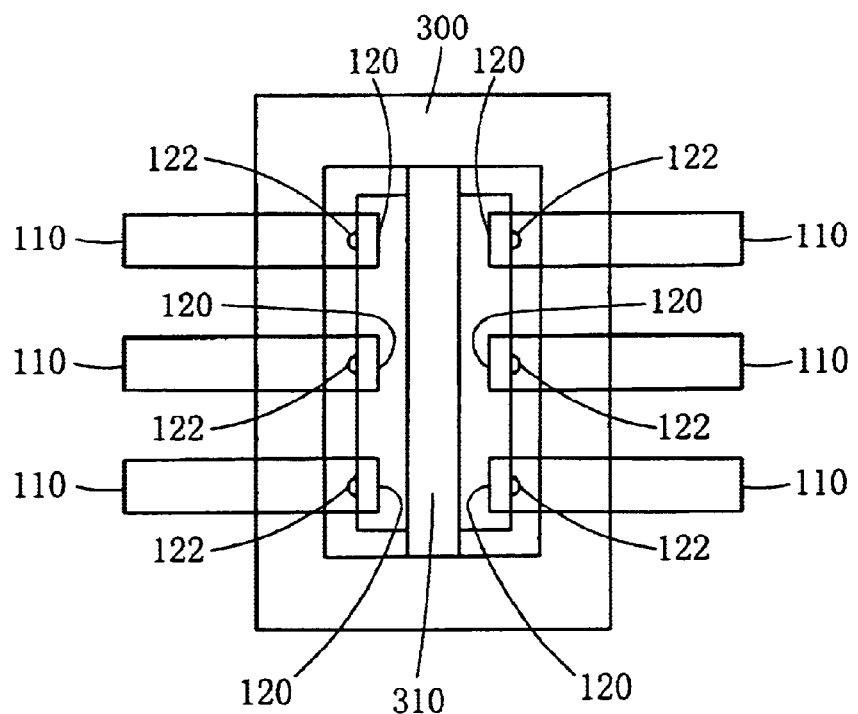
FIG. 12 is a plan view of the electric connector of the third embodiment.

FIG. 11 and FIG. 12 show the electric contact and the electric connector of the third embodiment. This electric connector is a male connector, which is mounted on a printed circuit board. This electric connector fits with a counterpart member, for example, a female connector of the second embodiment. The electric connector C comprises electric contacts 100, which have conductivity, and an insulating housing 300, which holds these electric contacts 100. The counterpart member of the electric contact 100 is a counterpart electric contact 510, which has conductivity. Here there are six electric contacts 100, but the number of poles of the present invention is not limited by this embodiment.

The electric contact 100 comprises a leg 110, which contacts a conductor 410 of the printed circuit board 400, and a connecting part 120, which is connected to the conductor of the counterpart electric contact 510. The leg 110 and the connecting part 120 of this electric contact 100 are not covered by the insulating housing 300 but exposed. The connecting part 120 of the electric contact 100 is formed to fit with the connecting part of the counterpart electric contact 510.

Figure 13:
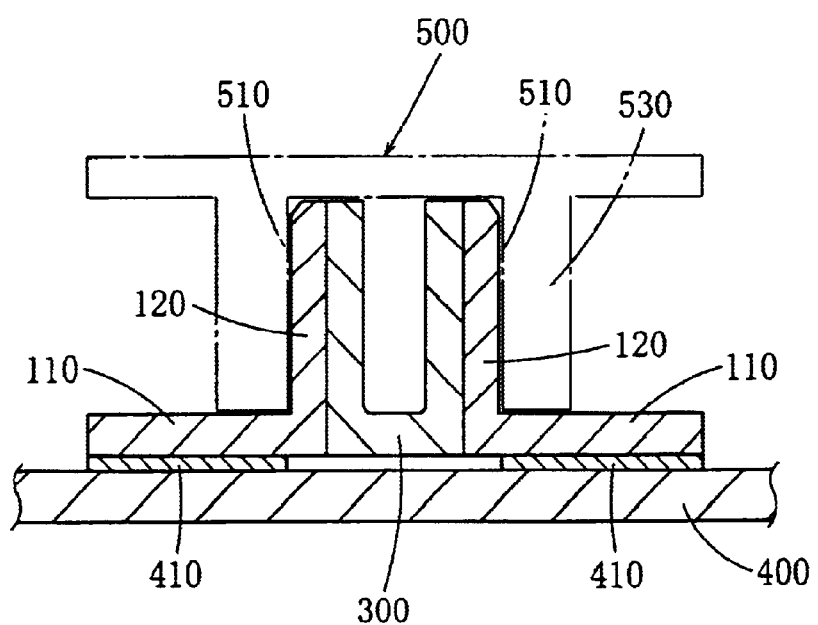
FIG. 13 is a sectional view of the electric connector of the third embodiment, which is mounted on a printed circuit board.

As shown in FIG. 13, the counterpart electric contacts 510 are held in the insulating housing 530 of the counterpart electric connector 500. This insulating housing 530 is formed into a box having a concaved part. The counterpart electric contacts 510 extend on the inner wall of the concaved part in the direction of insertion and withdrawal of the counterpart electric connector 500. On the other hand, the insulating housing 300 of the electric connector C has a protrusion at the center thereof. The concaved part of the counterpart electric connector 500 fits with this protrusion. The electric contact 100 is formed into a bar, and in this embodiment, it is formed into an L form. The connecting part 120 of the electric contact 100 is set in and exposed on the surface of the protrusion of the insulating housing 300, and the connecting part 120 extends in the direction of insertion and withdrawal of the counterpart electric connector 500. The leg 110 protrudes sideways from the insulating housing 300. When necessary, a slit 310 is formed in the protrusion of insulating housing 300 to split it into two parts. With this arrangement, springiness in the width direction can be given to the protrusion to enhance its performance in fitting with the concaved part of the counterpart electric connector 500. 122 denotes a small protrusion, which is formed, when necessary, on the connecting part 120. With this arrangement, the contacting pressure against the counterpart electric connector 500 can be increased.

In this electric contact 100, at least the part of the leg 110, which contacts the conductor 410 of the printed circuit board 400, is made of the lead-free ultrahigh-conductive plastic being the conductive resin composite, and other parts are made of another material having conductivity. In the case of this embodiment, the electric contact 100 is entirely made of the lead-free ultrahigh-conductive plastic.

The insulating housing 300 is made of a thermoplastic resin, and the electric contacts 100 and the insulating housing 300 are molded integrally.

This electric connector C can be produced by the so-called multi-color injection molding, wherein the electric contacts 100 and the insulating housing 300 are molded stepwise by injection molding. If a material other than thermoplastic resins, for example, a metal, is partly used, the electric connector C may be produced by insert molding.

The method of mounting the electric contact and the electric connector of the third embodiment on a printed circuit board and the functions and effects obtained are similar to those of the first embodiment.

Figure 14:
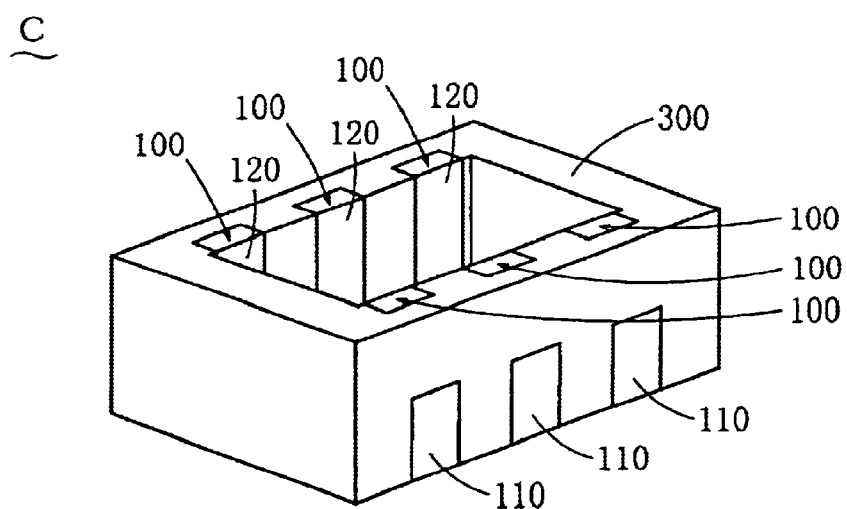
FIG. 14 is a perspective view of the electric connector of the fourth embodiment.
Figure 15:
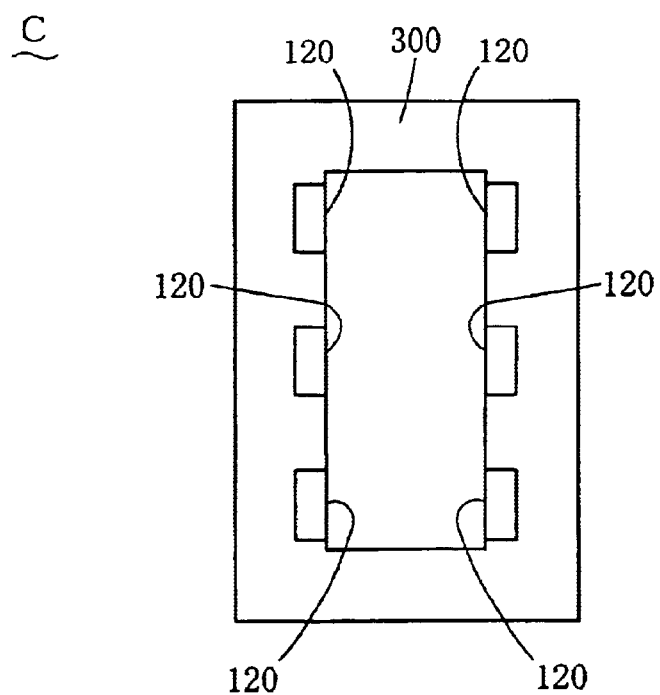
FIG. 15 is a plan view of the electric connector of the fourth embodiment.
Figure 16:
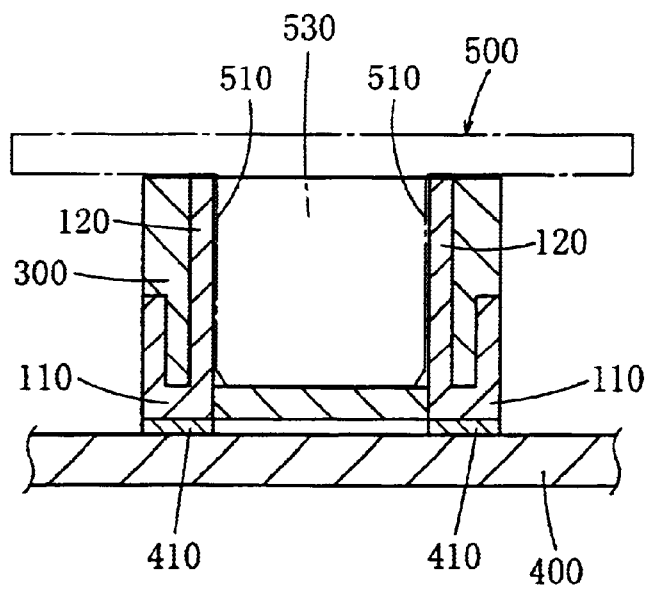
FIG. 16 is a sectional view of the electric connector of the fourth embodiment, which is mounted on a printed circuit board.

FIG. 14 through FIG. 16 show the electric contact and the electric connector of the fourth embodiment. This electric connector is a female connector, which is mounted on a printed circuit board. The closest embodiment to this female connector is the second embodiment. This embodiment differs from the second embodiment in the configuration of the leg 110 of the electric contact 100. The leg 110 of this embodiment extends sideways along the bottom face of the insulating housing 300, then rises along and sets in the external surface of the insulating housing 300. The electric contact 100 is formed into a bar, and here it is formed into a J form.

The method of producing the electric contact and the electric connector of the fourth embodiment, the method of mounting them on a printed circuit board, and the functions and effects obtained are similar to those of the second embodiment. In addition to them, as the leg 110 rises along the external surface of the insulating housing 300, the mounting area is more compact in comparison with the second embodiment.

Figure 17:
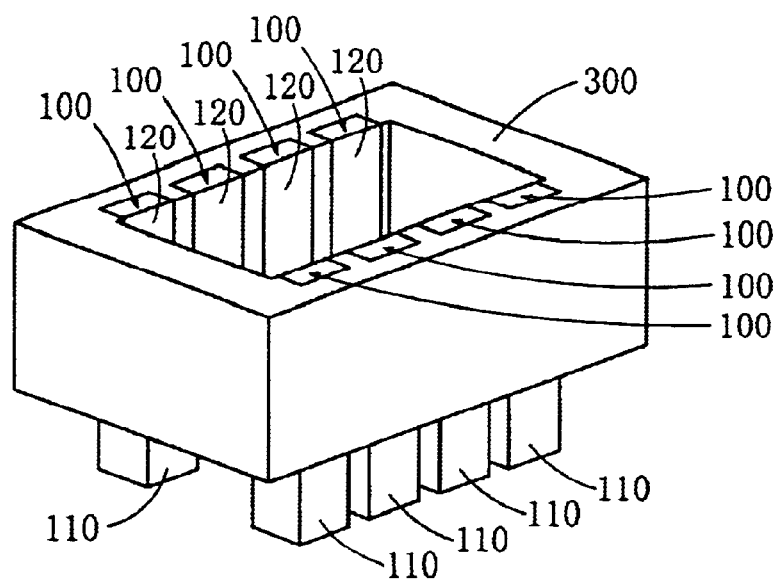
FIG. 17 is a perspective view of the electric connector of the fifth embodiment.
Figure 18:
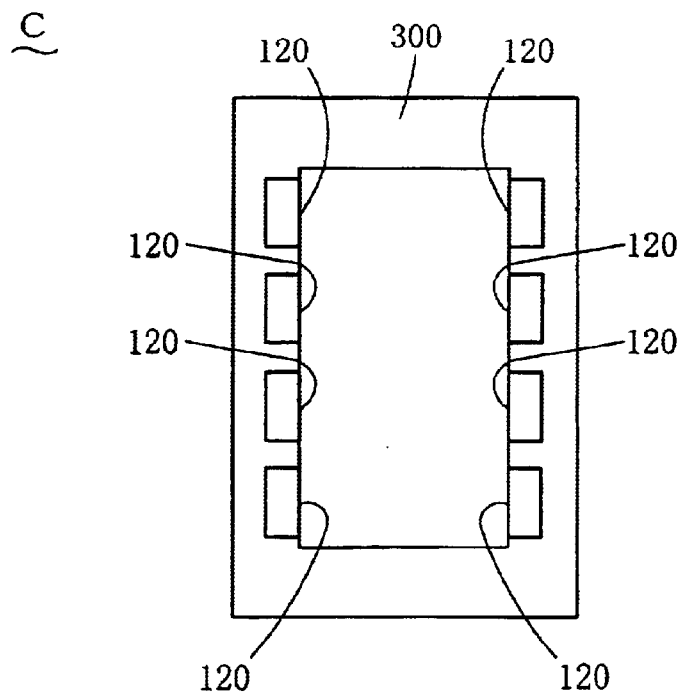
FIG. 18 is a plan view of the electric connector of the fifth embodiment.
Figure 19:
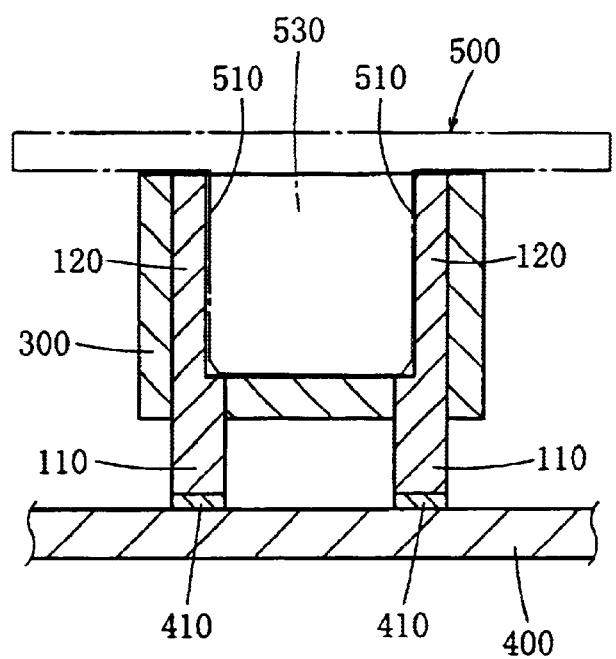
FIG. 19 is a sectional view of the electric connector of the fifth embodiment, which is mounted on a printed circuit board.

FIG. 17 through FIG. 19 show the electric contact and the electric connector of the fifth embodiment. This electric connector is a female connector, which is mounted on a printed circuit board. The closest embodiment to this female connector is the second embodiment. This embodiment differs from the second embodiment in the configuration of the leg 110 of the electric contact 100. The leg 110 of this embodiment extends beyond the bottom of the insulating housing 300 in the direction of the insertion and withdrawal of the counterpart electric connector 500. The electric contact 100 is formed into a bar, and here it is formed straight.

The method of producing the electric contact and the electric connector of the fifth embodiment, the method of mounting them on a printed circuit board, and the functions and effects obtained are similar to those of the second embodiment. In addition to them, as the leg 110 rises along the external surface of the insulating housing 300, the mounting area is more compact in comparison with the second embodiment.

Figure 20:
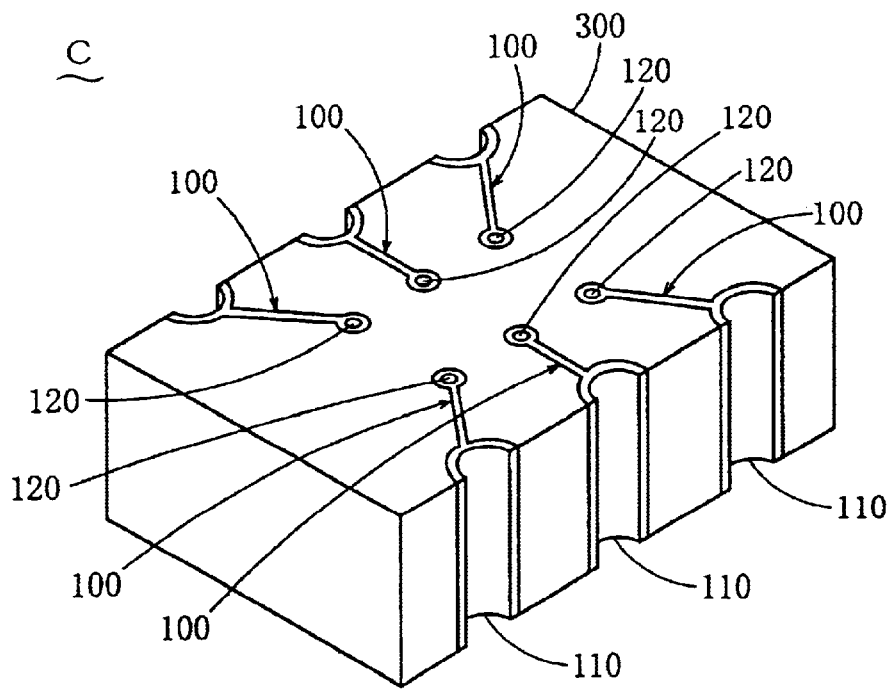
FIG. 20 is a perspective view of the electric connector of the sixth embodiment.
Figure 21:
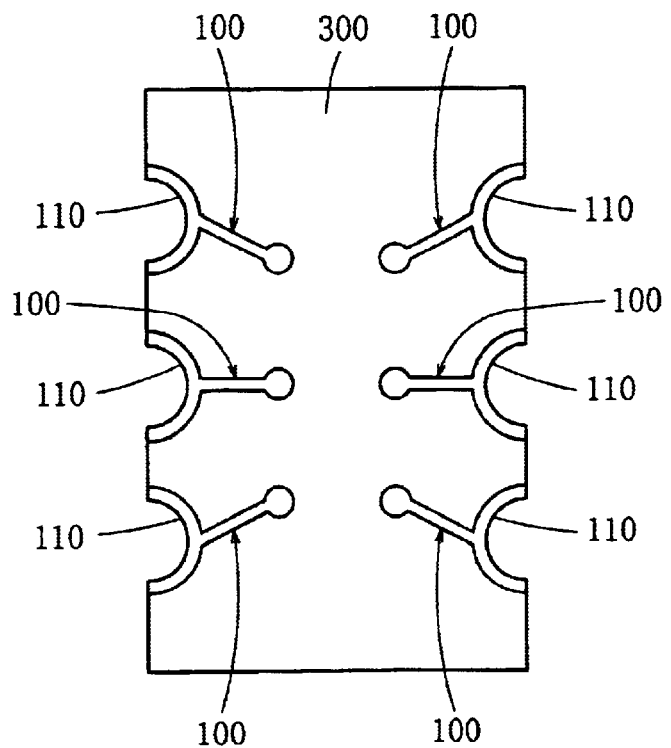
FIG. 21 is a bottom view of the electric connector of the sixth embodiment.
Figure 22:
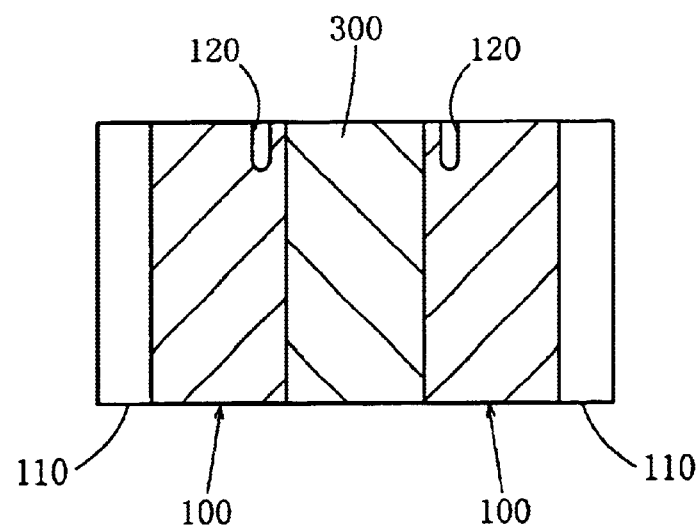
FIG. 22 is a sectional view of the electric connector of the sixth embodiment.

FIG. 20 through FIG. 22 show the electric contact and the electric connector of the sixth embodiment. This electric connector is a female connector, which is mounted on a printed circuit board. This electric connector fits with the insertion-mounting type PGA (Pin Grid Array) package wherein pins forming a matrix protrude from the bottom. This PGA package is, for example, an IC package. This electric connector C comprises electric contacts 100, which have conductivity, and an insulating housing 300, which holds these electric contacts 100. The counterpart member of the electric contact 100 is the pin 510, which has conductivity, of the PGA package 500. In this embodiment, there are six electric contacts 100, but the number of the poles is not limited by this embodiment.

The electric contact 100 comprises a leg 110, which contacts a conductor 410 of the printed circuit board 400, and a connecting part 120, which is connected to a pin 510 of the PGA package. The leg 110 and the connecting part 120 of this electric contact 100 are not covered by the insulating housing 300 but exposed. The connecting part 120 of the electric contact 100 is formed to fit with the pin 510 of the PGA package 500.

Figure 23:
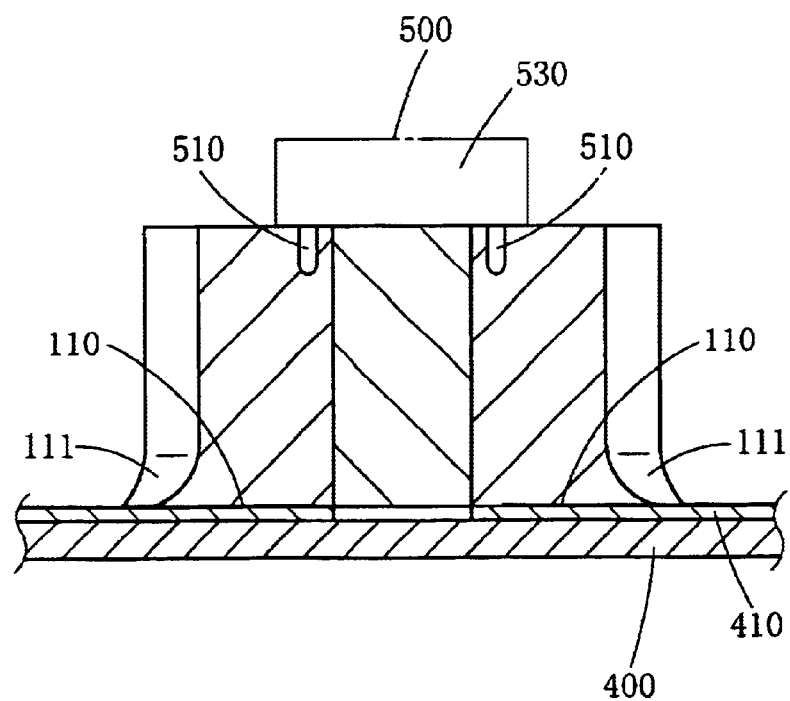
FIG. 23 is a sectional view of the electric connector of the sixth embodiment, which is mounted on a printed circuit board.

As shown in FIG. 23, the pin 510 protrudes from the bottom of the insulating housing 530 of the PGA package 500. On the other hand, the insulating housing 300 of the electric connector C is formed into a thick plate. The electric contact 100 is formed into a plate and penetrates the insulating housing 300 from the top face to the bottom face thereof. The bottom side of this electric contact 100 is exposed on the bottom face of the insulating housing 300 and this forms the leg 110. The top side of the electric contact 100 is exposed on the top face of the insulating housing 300, and a hole, into which the pin 510 fits, is formed in the exposed top side, and this forms the connecting part 120. The outer side of the electric contact 100 reaches a side face of the insulating housing 300. And the top end thereof broadens towards the end to form a curved face having a U-shaped cross section. This curved face is provided when necessary, but when it is provided, the fillet 111, which is formed when the leg 110 is connected to the conductor 410 of the printed circuit board 400, gets longer and the volume also increases in comparison with the case wherein the electric contact 100 is formed into a simple plate form. As a result, stresses, which are generated by temperature change or the like in the fillet 111 due to the difference in shrinkage rate between the printed circuit board and the fillet 111, will be dispersed and moderated; thus troubles such as formation of cracks in the fillet 111 can be avoided.

In this electric contact 100, at least the part of the leg 110, which contacts the conductor 410 of the printed circuit board 400, is made of the lead-free ultrahigh-conductive plastic being the conductive resin composite, and the other parts are made of another material having conductivity. In the case of this embodiment, the electric contact 100 is entirely made of the lead-free ultrahigh-conductive plastic.

The insulating housing 300 is made of a thermoplastic resin, and the electric contacts and the insulating housing 300 are molded integrally.

This electric connector C can be produced by the so-called multi-color injection molding, wherein the electric contacts 100 and the insulating housing 300 are molded stepwise by injection molding. If a material other than thermoplastic resins, for example, a metal, is partly used, the electric connector C may be produced by insert molding.

The method of mounting the electric contact and the electric connector of the sixth embodiment on a printed circuit board and the functions and effects obtained are similar to those of the first embodiment. The pin 510 of the PGA package 500 corresponds to the counterpart electric contact 510.

Figure 24:
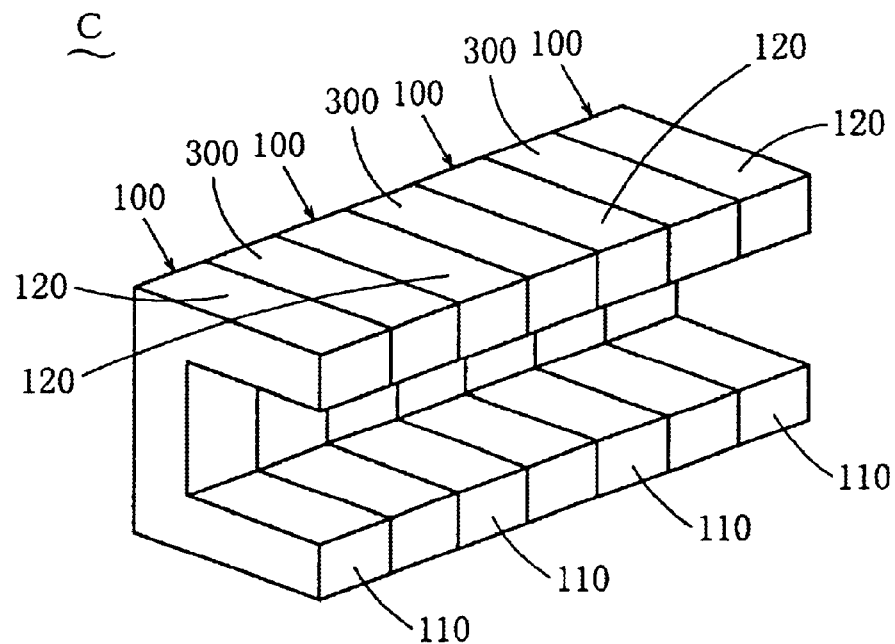
FIG. 24 is a perspective view of the electric connector of the seventh embodiment.

FIG. 24 shows the electric contact and the electric connector of the seventh embodiment. This electric connector is mounted on a printed circuit board. This electric connector C comprises electric contacts 100, which have conductivity, and insulating housings 300, which hold the electric contacts 100. The counterpart member of the electric contact 100 is a counterpart printed circuit board 800 having a conductor 810 on its surface. Here there are four electric contacts 100, but this does not limit the number of the poles.

The electric contact 100 comprises a leg 110, which contacts the conductor 410 of the printed circuit board 400, and a connecting part 120, which connects to the conductor 810 of the counterpart printed circuit board 800. The leg 110 and the connecting part 120 of the electric contact 100 are not covered by the insulating housing 300 but exposed. The connecting part 120 of the electric contact 100 is formed to contact the conductor 810 of the counterpart printed circuit board 800.

The electric contact 100 is formed into a bar, and here it is formed into a tilted-U form. The straight part on one end forms the leg 110, and the straight part on the other end forms the connecting part 120. The insulating housing 300 is also formed into a bar, and here it is formed into a tilted-U form. One insulating housing 300 is fixed between two adjacent electric contacts 100, and the electric contacts 100 are held by this insulating housing 300. The legs 110 and the connecting parts 120 of the electric contacts 100 are not covered by the insulating housings 300 but exposed.

In this electric contact 100, at least the part of the leg 110, which contacts the conductor 410 of the printed circuit board 400, is made of the lead-free ultrahigh-conductive plastic being the conductive resin composite, and the other parts are made of another material having conductivity. In the case of this embodiment, the electric contact 100 is entirely made of the lead-free ultrahigh-conductive plastic.

The insulating housing 300 is made of a thermoplastic resin, and the electric contacts and the insulating housing 300 are molded integrally.

This electric connector C can be produced by the so-called multi-color injection molding, wherein the electric contacts 100 and the insulating housings 300 are molded stepwise by injection molding. If a material other than thermoplastic resins, for example, a metal, is partly used, the electric connector C may be produced by insert molding.

Figure 25:
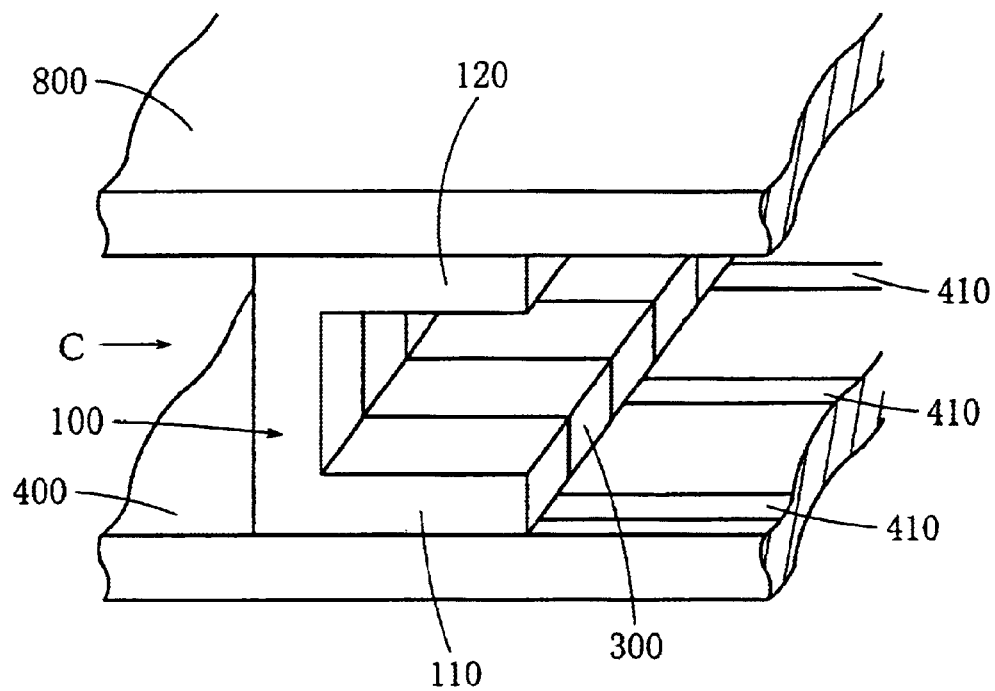
FIG. 25 is a perspective view of the electric connector of the seventh embodiment, which is mounted on a printed circuit board.
Figure 26:
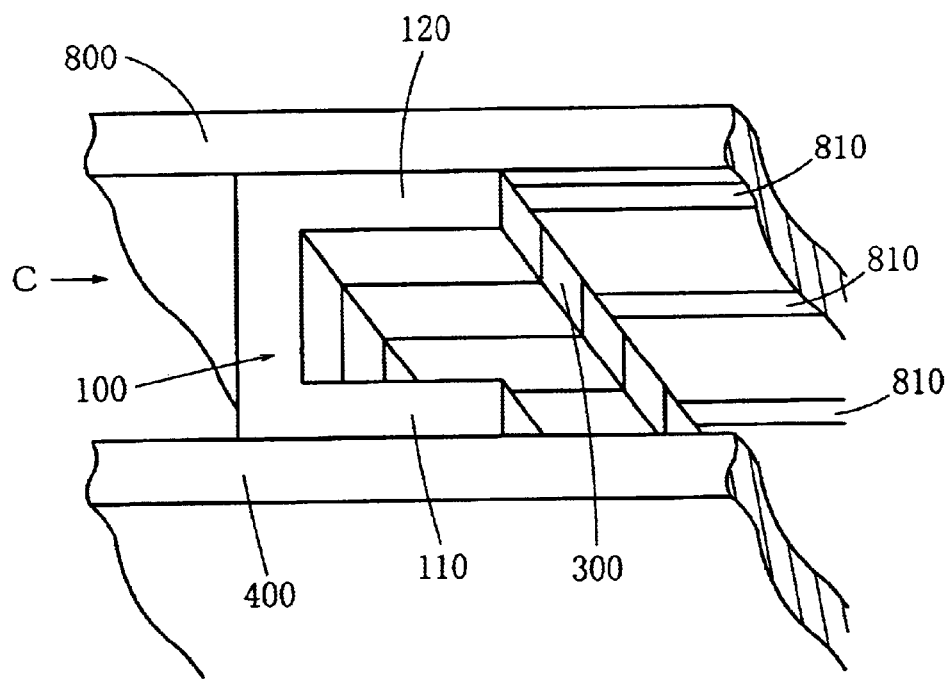
FIG. 26 is a perspective view of the electric connector of the seventh embodiment, which is mounted on the printed circuit board. It is seen from a different aspect.

The method of mounting the electric contact 100 and the electric connector C of the seventh embodiment on a printed circuit board 400 and the functions and effects obtained are similar to those of the first embodiment. The counterpart electric contact 510 corresponds to the counterpart printed circuit board 800 (refer to FIG. 25 and FIG. 26, which show the mode of use). In the case of the seventh embodiment, the conductors 410, 810 of two printed circuit boards 400, 800 are connected to each other by the electric contact 100 using resin solder. In that case, when at least the part of the connecting part 120, which connects to the conductor 810 of the counterpart printed circuit board 800, is made of the lead-free ultrahigh-conductive plastic, the functions and effects, which are obtained between the electric contact 100 and the printed circuit board 400, will be obtained between the electric contact 100 and the counterpart printed circuit board 800 as well.

Figure 27:
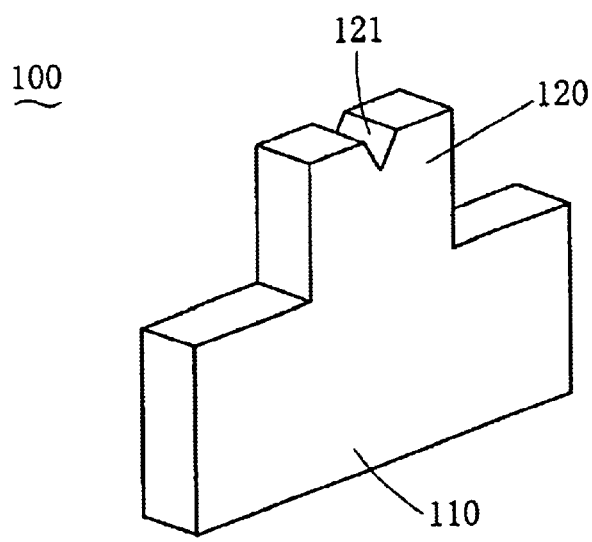
FIG. 27 is a perspective view of the electric contact of the eighth embodiment.

FIG. 27 shows the electric contact of the eighth embodiment. This electric contact is mounted on a printed circuit board. The counterpart member of this electric contact 100 is an electric wire 900.

The electric contact 100 comprises a leg 110, which contacts a conductor 410 of a printed circuit board 400, and a connecting part 120, which is connected to a core wire 910 being the conductor of the electric wire 900. The electric contact is formed into a plate, of which one side forms the leg 110 and another side forms the connecting part 120.

The connecting part 120 is formed to connect the electric wire 900. In this embodiment, a groove 121 is formed in one edge of the connecting part 120, and the core wire 910 of the end of the electric wire 900 is fitted into this groove.

In this electric contact 100, at least the part of the leg 110, which contacts the conductor 410 of a printed circuit board 400, is made of the lead-free ultrahigh-conductive plastic being the conductive resin composite, and other parts are made of another material having conductivity. In the case of this embodiment, the electric contact 100 is entirely made of the lead-free ultrahigh-conductive plastic.

Figure 28:
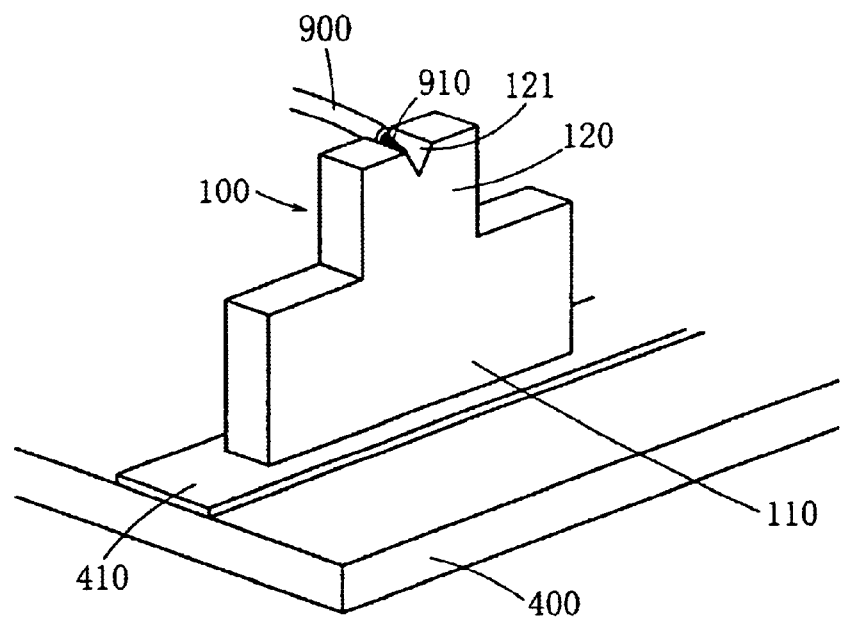
FIG. 28 is a perspective view of the electric contact of the eighth embodiment, which is mounted on a printed circuit board.

As shown in FIG. 28, the leg 110 of the electric contact is made to contact the conductor 410 of the printed circuit board 400. When the leg 110 is heated under this condition, the lead-free solder being contained in the lead-free ultrahigh-conductive plastic of the leg 110 will melt out and stick to the conductor 410 of the printed circuit board 400. When the solder cools and solidifies, the electric contact 100 will be mounted on the printed circuit board 400. The above-mentioned heating is effected by, for example, blowing hot air or irradiating high frequency waves or laser beams to give thermal energy. Hence the work of separately applying solder is not required. Accordingly, even when it is difficult or impossible to solder the electric contact 100, for example, when another part is mounted too close to the electric contact 100, the electric contact 100 can be mounted on the printed circuit board 400. Moreover, as solder quality control, temperature control and the like are not required, the man-hours required for control are reduced correspondingly. Further, even if the electric contact 100 is microminiaturized, the mounting of the electric contact 100 can be easily done by an automatic machine. Hence the productivity is increased and the cost is reduced. The lead-free ultrahigh-conductive plastic exhibits high conductivity, $10^{-3} \Omega \cdot cm$ or under in volume resistivity. Hence the electric resistance of the electric contact 100 can be lowered. Moreover, after the mounting of the electric contact 100 on the printed circuit board 400, when electricity is passed at a normal level, the lead-free ultrahigh-conductive plastic will not melt out due to heat generation. Further, in comparison with the technology of MID, wherein a conductive plated layer is formed on the surface of an insulator, the lead-free ultrahigh-conductive plastic provides the conductor with a larger cross-sectional area and a larger volume. Hence the resistance of the conductor can be reduced and the heat dissipation is better. This, in turn, allows passage of a larger current. Moreover, as the lead-free ultrahigh-conductive plastic can be molded by injection molding, it gives a greater freedom in molding. Hence it is easy to obtain impedance matching.

The electric contact 100 of the eighth embodiment is entirely made of the lead-free ultrahigh-conductive plastic. In contrast to it, when only a part of the electric contact is made of the lead-free ultrahigh-conductive plastic, if other parts are made of a conductive material of which strength and elasticity are higher than those of the lead-free ultrahigh-conductive plastic, such as a metal, the strength and elasticity of the electric contact will be increased. In that case, the electric contact 100 can be produced by insert molding, which is a kind of injection molding.

The present invention does not limit the configuration of the connecting part of the electric contact. Among the embodiments of the present invention, the connecting part 120 of the electric contact 100 of the eighth embodiment is provided with the groove 121 for fitting the electric wire 900 into it. With this arrangement, the electric wire 900 is connected, via the electric contact 100, to the conductor 410 of the printed circuit board 400. In that case, if at least the part of the connecting part 120, to which the core wire 910 of the electric wire 900 is connected, is made of the lead-free ultrahigh-conductive plastic, the electric wire 900 can be connected to the connecting part 120 by the above-mentioned connecting function of the lead-free solder. Then the work of separately applying solder is not required, and even if it is difficult or impossible to solder, for example, when the connecting part 120 is at a recess of the electric contact 100, the electric wire 900 can be easily connected. Moreover, solder quality control, temperature control and the like are not required, and the man-hours required for control are reduced correspondingly. Further, the connection of a very fine wire can be done by an automatic machine, and the productivity is enhanced and the cost is reduced. Also, a larger current can be passed. Furthermore, as the degree of freedom in molding is high, the part of the connecting part 120, which is made of the lead-free ultrahigh-conductive plastic, can be molded into a variety of configurations according to the requirements of different applications. Other modes of the connecting part 120 for connecting it to the electric wire 900 include a mode wherein the surface of the connecting part 120 is formed into a simple plane, a mode wherein a hole is made, a mode wherein a barrel is provided, and a mode wherein crimping slots are provided. In the above-mentioned embodiment, the connecting part 120 is provided with the groove 121 into which the electric wire 900 is fitted, thus the workability of connecting the electric wire 900 is good. The workability is also good when the mode using a hole is adopted.

Figure 29:
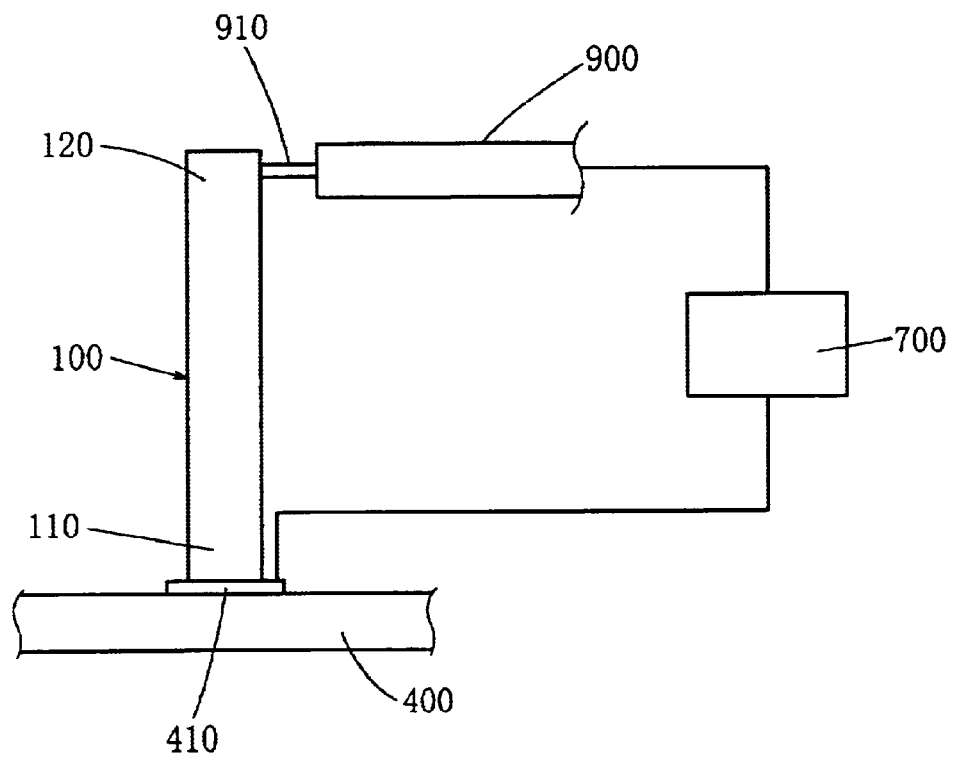
FIG. 29 is a schematic diagram showing another embodiment of the method of connecting the electric contact of the eighth embodiment to a printed circuit board.

Another embodiment of the method of connecting this electric contact 100 to the printed circuit board 400 will be described. As shown in FIG. 29, first the leg 110 of the electric contact 100 is made to contact a conductor 410 of the printed circuit board 400. Next, electricity is passed between the electric contact 100 and the conductor 410 of the printed circuit board 400 by a power source 700 to melt the lead-free solder being contained in the leg 110 of the electric contact 100 and connect the electric contact 100 to the conductor 410.

When this connecting method is used, as the leg 110 generates heat by itself, even when it is difficult to externally heat the leg 110, the electric contact 100 can be connected to the conductor 410 of the printed circuit board 400. In this case, the two poles of the power source 700 are connected to the electric contact 100 and the conductor 410 of the printed circuit board 400, but as shown in FIG. 29, one pole may be connected to the core wire 910 of the electric wire 900, which is fitted to the connecting part 120. With this arrangement, in the case of this embodiment, as the connecting part 120 is also made of the lead-free ultrahigh-conductive plastic, the lead-free solder being contained in the connecting part 120 will also melt and connect the core wire 910 to the connecting part 120.

The present invention includes embodiments of the electric connector, which comprises the electric contact 100 of the eighth embodiment and an insulating housing, which holds the electric contact 100. In that case, the number of the electric contact may be plural.

Figure 30:
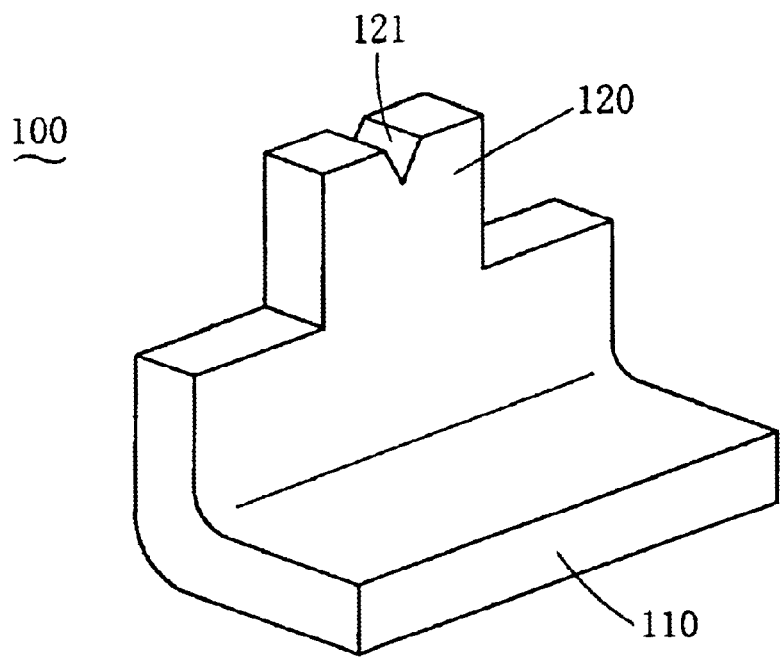
FIG. 30 is a perspective view of the electric contact of the ninth embodiment.

FIG. 30 shows the ninth embodiment of the electric contact. This electric contact is mounted on a printed circuit board. The closest embodiment to this electric contact is the eighth embodiment. This embodiment differs from the eighth embodiment in the configuration of the leg 110 of the electric contact 100. The leg 110 of this embodiment bends at an angle of about 90 degrees to the connecting part 120. Thus the electric contact 100 is formed into an L form.

The method of mounting the electric contact of the ninth embodiment on a printed circuit board, and the functions and effects obtained are similar to those of the eighth embodiment. In addition to them, as the leg 110 has an angle of about 90 degrees to the connecting part 120, the stability when the electric contact is placed on the printed circuit board 400 is higher.

The present invention includes embodiments wherein features of the embodiments described above are combined.

With the description of these embodiments, the first electric contact using resin solder, which was described in the summary of the invention, has been fully disclosed. Moreover, with the description of these embodiments, the second through fourth electric contacts using resin solder, the method of connecting these electric contacts using resin solder to a printed circuit board, the first and second electric connectors using resin solder, and the method of connecting these electric connectors using resin solder to a printed circuit board, which will be described below, have been fully explained.

The second electric contact using resin solder is the above-mentioned first electric contact using resin solder, wherein the counterpart member is an electric contact, and the connecting part is formed to fit with the connecting part of the counterpart electric contact.

With this arrangement, the counterpart electric contact is connected to the printed circuit board via the second electric contact using resin solder.

The third electric contact using resin solder is the above-mentioned first electric contact using resin solder, wherein the counterpart member is a counterpart printed circuit board, which has a conductor being provided on a surface thereof, and the connecting part is formed to contact the conductor of the counterpart printed circuit board.

With this arrangement, the conductors of two printed circuit boards are connected to each other via the third electric contact using resin solder. In that case, when at least the part of the connecting part, which connects to the conductor of the counterpart printed circuit board, is made of the lead-free ultrahigh-conductive plastic, the effects which are obtained between the first electric contact using resin solder and the printed circuit board can be obtained between the electric contact using resin solder and the counterpart printed circuit board.

The fourth electric contact using resin solder is the above-mentioned first electric contact using resin solder, wherein the counterpart member is an electric wire, and the connecting part is formed to be connected to the electric wire.

With this arrangement, the electric wire is connected to the printed circuit board via the fourth electric contact using resin solder. In that case, when at least the part of the connecting part, which is connected to the conductor of the electric wire, is made of the lead-free ultrahigh-conductive plastic, the electric wire can be connected to the connecting part by the above-mentioned connecting function of the lead-free solder. Then, as the work of separately applying solder is not required, even when it is difficult or impossible to solder the connecting part, for example, when the connecting part is at a recess of the electric contact, the electric wire can be easily connected to the connecting part. Moreover, as solder quality control, temperature control and the like are not required, the man-hours required for control are reduced. Further, the connection of a very fine wire can be done by an automatic machine, and the productivity is enhanced and the cost is reduced. Moreover, a larger current can be passed. As the degree of freedom in molding is high, the part of the connecting part, which is made of the lead-free ultrahigh-conductive plastic, can be molded into a variety of configurations according to the requirements of different applications.

The method of connecting any one of the first through fourth electric contacts using resin solder to the printed circuit board comprises making the leg of the electric contact using resin solder contact the conductor of the printed circuit board, and passing electricity between the electric contact and the conductor of the printed circuit board to melt the lead-free solder being contained in the leg and connect the electric contact to the conductor.

When this connecting method is used, as the leg generates heat by itself, even when it is difficult to externally heat the leg, the electric contact can be connected to the conductor of the printed circuit board.

The first electric connector using resin solder comprises any one of the first through fourth electric contacts using resin solder and an insulating housing, which holds the electric contact.

When the electric contact of this electric connector is connected to the printed circuit board at the leg, which is exposed from the insulating housing, and the connecting part is connected to the conductor of the counterpart member, the electric connector will be mounted on the printed circuit board. The functions and effects are similar to those which can be obtained by any one of the first through fourth electric contacts using resin solder.

The second electric connector using resin solder is the first electric connector using resin solder, wherein the insulating housing is made of a thermoplastic resin and the electric contact and the insulating housing are molded integrally.

With this arrangement, as the electric connector is produced by injection molding or the like, the efficiency of production is higher than the case wherein the electric contact and the insulating housing are produced separately and they are assembled together. Thus it is suited to mass production.

The method of connecting the first or second electric connector using resin solder to the printed circuit board comprises making the leg of the electric contact using resin solder contact the conductor of the printed circuit board, and passing electricity between the electric contact and the conductor of the printed circuit board to melt the lead-free solder being contained in the leg and connect the electric contact to the conductor.

When this connecting method is used, as the leg generates heat by itself, even when it is difficult to externally heat the leg, for example, due to interference by the insulating housing, the electric contact can be connected to the conductor of the printed circuit board.

What is claimed is:

1. An electric contact using resin solder, which is connected to a printed circuit board, which has a conductor being provided on a surface thereof, the electric contact comprising a leg, which contacts the conductor of the printed circuit board, and a connecting part, which is connected to a conductor of a counterpart member, and at least a part of the leg, which contacts the conductor of the printed circuit board, is made of a lead-free ultrahigh-conductive plastic being a conductive resin composite, comprising a thermoplastic resin, a lead-free solder that can be melted in the plasticated thermoplastic resin, and powder of a metal that assists fine dispersion of the lead-free solder in the thermoplastic resin or a mixture of the powder of the metal and short fibers of a metal.

2. An electric contact using resin solder as recited in claim 1, wherein the counterpart member is an electric contact, and the connecting part is formed to fit with the connecting part of the counterpart electric contact.

3. An electric contact using resin solder as recited in claim 1, wherein the counterpart member is a counterpart printed circuit board, which has a conductor being provided on a surface thereof, and the connecting part is formed to contact the conductor of the counterpart printed circuit board.

4. An electric contact using resin solder as recited in claim 1, wherein the counterpart member is an electric wire, and the connecting part is formed to be connected to the electric wire.

5. A method of connecting the electric contact using resin solder of claim 1 to the printed circuit board, the method comprising making the leg of the electric contact using resin solder contact the conductor of the printed circuit board, and passing electricity between the electric contact and the conductor of the printed circuit board to melt the lead-free solder being contained in the leg and connect the electric contact to the conductor.

6. A method of connecting the electric contact using resin solder of claim 2 to the printed circuit board, the method comprising making the leg of the electric contact using resin solder contact the conductor of the printed circuit board, and passing electricity between the electric contact and the conductor of the printed circuit board to melt the lead-free solder being contained in the leg and connect the electric contact to the conductor.

7. A method of connecting the electric contact using resin solder of claim 3 to the printed circuit board, the method comprising making the leg of the electric contact using resin solder contact the conductor of the printed circuit board, and passing electricity between the electric contact and the conductor of the printed circuit board to melt the lead-free solder being contained in the leg and connect the electric contact to the conductor.

8. A method of connecting the electric contact using resin solder of claim 4 to the printed circuit board, the method comprising making the leg of the electric contact using resin solder contact the conductor of the printed circuit board, and passing electricity between the electric contact and the conductor of the printed circuit board to melt the lead-free solder being contained in the leg and connect the electric contact to the conductor.

9. An electric connector using resin solder comprising the electric contact using resin solder of claim 1, and an insulating housing, which holds the electric contact.

10. An electric connector using resin solder comprising the electric contact using resin solder of claim 2, and an insulating housing, which holds the electric contact.

11. An electric connector using resin solder comprising the electric contact using resin solder of claim 3, and an insulating housing, which holds the electric contact.

12. An electric connector using resin solder comprising the electric contact using resin solder of claim 4, and an insulating housing, which holds the electric contact.

13. An electric connector using resin solder as recited in claim 9, wherein the insulating housing is made of a thermoplastic resin, and the electric contact and the insulating housing are molded integrally.

14. An electric connector using resin solder as recited in claim 10, wherein the insulating housing is made of a thermoplastic resin, and the electric contact and the insulating housing are molded integrally.

15. An electric connector using resin solder as recited in claim 11, wherein the insulating housing is made of a thermoplastic resin, and the electric contact and the insulating housing are molded integrally.

16. An electric connector using resin solder as recited in claim 12, wherein the insulating housing is made of a thermoplastic resin, and the electric contact and the insulating housing are molded integrally.

17. A method of connecting the electric connector using resin solder of claim 9 to the printed circuit board, the method comprising making the leg of the electric contact using resin solder contact the conductor of the printed circuit board, and passing electricity between the electric contact and the conductor of the printed circuit board to melt the lead-free solder being contained in the leg and connect the electric contact to the conductor.

* * * * *